United States Patent
Koiwa et al.

(10) Patent No.: US 10,515,786 B2
(45) Date of Patent: Dec. 24, 2019

(54) MOUNTING TABLE AND PLASMA PROCESSING APPARATUS

(71) Applicant: Tokyo Electron Limited, Tokyo (JP)

(72) Inventors: Shingo Koiwa, Miyagi (JP); Yasuhisa Kudo, Miyagi (JP); Katsuyuki Koizumi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 414 days.

(21) Appl. No.: 15/270,342

(22) Filed: Sep. 20, 2016

(65) Prior Publication Data

US 2017/0092472 A1    Mar. 30, 2017

(30) Foreign Application Priority Data

Sep. 25, 2015   (JP) ................... 2015-187827
Dec. 18, 2015   (JP) ................... 2015-247630

(51) Int. Cl.
*H01J 37/32*   (2006.01)
*H01L 21/67*   (2006.01)
*H01L 21/683*  (2006.01)
*F28F 27/02*   (2006.01)

(52) U.S. Cl.
CPC ........ *H01J 37/32724* (2013.01); *F28F 27/02* (2013.01); *H01J 37/32532* (2013.01); *H01J 37/32715* (2013.01); *H01J 37/32798* (2013.01); *H01L 21/67103* (2013.01); *H01L 21/67109* (2013.01); *H01L 21/6833* (2013.01); *H01J 2237/32* (2013.01)

(58) Field of Classification Search
None
See application file for complete search history.

(56) References Cited

U.S. PATENT DOCUMENTS

| | | | | |
|---|---|---|---|---|
| 5,376,213 A | * | 12/1994 | Ueda | C23C 16/4586 |
| | | | | 156/345.27 |
| 5,556,500 A | * | 9/1996 | Hasegawa | H01J 37/32623 |
| | | | | 156/345.27 |
| 5,775,416 A | * | 7/1998 | Heimanson | C23C 14/50 |
| | | | | 118/725 |

(Continued)

FOREIGN PATENT DOCUMENTS

JP    2003124296 A1 *   4/2003
JP    5482282 B2          2/2014

*Primary Examiner* — Charlee J C Bennett
(74) *Attorney, Agent, or Firm* — Brundidge & Stanger, P.C.

(57) ABSTRACT

A mounting table includes a cooling table, a power feed body, an electrostatic chuck, a first elastic member and a clamping member. The power feed body is connected to the cooling table to transmit a high frequency power. A base of the electrostatic chuck has conductivity. An attraction unit has an attraction electrode and a heater therein, and is fastened to the base by metal bonding. The first elastic member is provided between the cooling table and the base to allow the electrostatic chuck to be spaced apart from the cooling table. The first elastic member forms, along with the cooling table and the base, a heat transfer space into which a heat transfer gas is supplied. The clamping member is contacted with the cooling table and the base, and allows the base and the first elastic member to be interposed between the cooling table and the clamping member.

16 Claims, 15 Drawing Sheets

(56) References Cited

U.S. PATENT DOCUMENTS

| | | | | |
|---|---|---|---|---|
| 5,870,271 A * | 2/1999 | Herchen | | H02N 13/00 361/234 |
| 6,022,418 A * | 2/2000 | Iwabuchi | | C23C 16/401 118/500 |
| 6,990,173 B1 * | 1/2006 | Kawakami | | G03F 7/70816 378/34 |
| 2002/0029745 A1 * | 3/2002 | Nagaiwa | | C23C 16/4581 118/723 E |
| 2002/0094306 A1 * | 7/2002 | Hara | | G05D 16/2013 422/112 |
| 2003/0168439 A1 * | 9/2003 | Kanno | | H01L 21/67109 219/390 |
| 2004/0027781 A1 * | 2/2004 | Hanawa | | H01J 37/32706 361/234 |
| 2007/0089834 A1 * | 4/2007 | Brillhart | | H01L 21/67069 156/345.27 |
| 2009/0014323 A1 * | 1/2009 | Yendler | | H01J 37/20 204/298.33 |
| 2009/0159588 A1 * | 6/2009 | Morioka | | H01L 21/67103 219/444.1 |
| 2012/0055403 A1 * | 3/2012 | Gomi | | C23C 16/4404 118/725 |
| 2012/0132397 A1 * | 5/2012 | Silveira | | H01J 37/20 165/104.13 |
| 2012/0161405 A1 * | 6/2012 | Mohn | | C23C 16/401 279/142 |
| 2013/0105081 A1 * | 5/2013 | Silveira | | H01J 37/32724 156/345.27 |
| 2013/0286533 A1 * | 10/2013 | Takasaki | | H02N 13/00 361/234 |
| 2014/0110061 A1 * | 4/2014 | Okunishi | | H05H 1/46 156/345.52 |
| 2014/0159325 A1 * | 6/2014 | Parkhe | | H01L 21/67109 279/128 |
| 2014/0209245 A1 * | 7/2014 | Yamamoto | | H01J 37/32091 156/345.53 |
| 2014/0301010 A1 * | 10/2014 | Hayahara | | H01L 21/67109 361/234 |
| 2014/0346152 A1 * | 11/2014 | Sasaki | | H01L 21/6831 219/121.58 |
| 2015/0109716 A1 * | 4/2015 | Konno | | H01L 21/6831 361/234 |

\* cited by examiner

MOUNTING TABLE AND PLASMA PROCESSING APPARATUS

CROSS-REFERENCE TO RELATED APPLICATION

This application claims the benefit of Japanese Patent Application Nos. 2015-187827 and 2015-247630 filed on Sep. 25, 2015 and Dec. 18, 2015, respectively, the entire disclosures of which are incorporated herein by reference.

TECHNICAL FIELD

The embodiments described herein pertain generally to a mounting table and a plasma processing apparatus.

BACKGROUND

In the manufacture of an electronic device such as a semiconductor device, a substrate processing apparatus is used. Generally, the substrate processing apparatus includes a processing vessel, a mounting table and a gas supply unit. The mounting table is provided within the processing vessel. The mounting table has a main body on which a substrate is mounted; and a cooling table in which a coolant path is formed. The main body is disposed on the cooling table. Further, a heater is embedded in the main body. The gas supply unit is configured to supply a gas for substrate processing into the processing vessel.

In the substrate processing performed in this substrate processing apparatus, a temperature of the substrate may be set to a high temperature larger than, for example, 200° C. For this reason, a mounting table having high thermal insulating property between a cooling table and a main body is proposed in Patent Document 1 as follows.

The mounting table described in Patent Document 1 includes a multiple number of thermal insulators and an edge ring in addition to the cooling table and the main body. These thermal insulators are provided between the cooling table and the main body and between the cooling table and the edge ring. The edge ring is a substantially cylindrical member and is fixed on a peripheral portion of the cooling table via the thermal insulator, and the main body is interposed between the edge ring and the cooling table.

Patent Document 1: Japanese Patent No. 5,482,282

As one kind of substrate processing apparatuses, there is known a plasma processing apparatus. A mounting table of the plasma processing apparatus includes an electrostatic chuck. Further, in the plasma processing apparatus, a high frequency power for plasma generation and/or ion attraction is supplied to a conductive base of the electrostatic chuck. In this plasma processing apparatus as well, it may be required to process a substrate at a high temperature. For this reason, it is considered to adopt a structure in which the electrostatic chuck is spaced apart from the cooling table. In the mounting table having this structure, it is still required to provide a power feed route for supplying the high frequency power to the base of the electrostatic chuck. Further, a loss of the high frequency power in this power feed route needs to be suppressed.

SUMMARY

In one exemplary embodiment, there is provided a mounting table. The mounting table includes a cooling table, a power feed body, an electrostatic chuck, a first elastic member and a clamping member. The cooling table is made of a metal and is provided with a flow path for a coolant. The power feed body is made of aluminum or an aluminum alloy. Further, the power feed body is connected to the cooling table and constitutes a part of a power feed route configured to transmit a high frequency power from a high frequency power supply. The electrostatic chuck includes a base and an attraction unit. The base has conductivity, and is provided on the cooling table. The attraction unit is made of ceramics, and has an attraction electrode and a heater therein. Further, the attraction unit is provided on the base, and is fastened to the base by metal bonding. The first elastic member is provided between the cooling table and the base, and is configured to allow the electrostatic chuck to be spaced apart from the cooling table. Further, the first elastic member is configured to form, along with the cooling table and the base, a heat transfer space into which a heat transfer gas is supplied between the cooling table and the base. The clamping member is made of a metal, and is in contact with the cooling table and the base. Further, the clamping member allows the base and the first elastic member to be interposed between the cooling table and the clamping member.

In the mounting table according to this exemplary embodiment, the cooling table and the base are spaced apart from each other by the first elastic member. Further, in this mounting table, no adhesive is used in bonding the base and the attraction unit. Accordingly, it is possible to set the temperature of the electrostatic chuck to a high temperature larger than 200° C. Further, since the heat exchange can be made between the electrostatic chuck and the cooling table through the heat transfer gas supplied into the heat transfer space, the temperature of the electrostatic chuck can also be set to a low temperature. Furthermore, in this mounting table, the power feed body, the cooling table and clamping member constitute the power feed route for supplying the high frequency power to the base of the electrostatic chuck. Further, since the power feed body is not directly connected to the base of the electrostatic chuck, but is connected to the cooling table, the aluminum or the aluminum alloy can be used as a material of the power feed body. Accordingly, even when a high frequency power having a high frequency equal to or higher than 13.56 MHz is used, a loss of the high frequency power in the power feed body can be suppressed.

The cooling table includes a first central portion and a first peripheral portion. The first peripheral portion is continuous with the first central portion, and is extended in a circumferential direction at an outside of the first central portion in a diametric direction. The base of the electrostatic chuck is provided on the first central portion of the cooling table. Further, the base includes a second central portion and a second peripheral portion. The second peripheral portion is continuous with the second central portion, and is extended in the circumferential direction at an outside of the second central portion in the diametric direction. The clamping member includes a cylindrical portion and an annular portion. The cylindrical portion has a first bottom surface, and the annular portion has a second bottom surface and is inwardly extended from a top portion of the cylindrical portion in the diametric direction. Further, the clamping member is fastened to the first peripheral portion of the cooling table such that the first bottom surface is in contact with a top surface of the first peripheral portion and the second bottom surface is in contact with a top surface of the second peripheral portion.

The mounting table may further include a second elastic member. The second elastic member is an O-ring having insulating property, and is provided between an inner circumferential portion of the annular portion of the clamping member and the top surface of the second peripheral portion of the base. Since the top surface of the second peripheral portion of the base and the second bottom surface of the clamping member are in contact with each other, friction may be generated at a contact portion therebetween, so that a particle (e.g., metal powder) may be generated. The second elastic member is capable of suppressing the particle, even if such particle is generated, from adhering to the attraction unit and the substrate which is mounted on the attraction unit.

The first elastic member is configured to generate a reaction force larger than a reaction force generated by the second elastic member. Therefore, the electrostatic chuck can be spaced apart from the cooling table securely.

According to the exemplary embodiment, the first elastic member has thermal resistance higher than thermal resistance of the heat transfer space while a He gas is supplied into the heat transfer space. According to this exemplary embodiment, between the electrostatic chuck and the cooling table, thermal conduction through the heat transfer space is more dominant than thermal conduction through the first elastic member. Thus, a temperature distribution of the electrostatic chuck can be uniform. The first elastic member may be an O-ring made of perfluoroelastomer. This first elastic member has high thermal resistivity and low thermal conductivity.

The attraction unit is provided with a first gas line configured to supply the heat transfer gas into a gap between the attraction unit and a substrate placed on the attraction unit. The cooling table is provided with a second gas line configured to supply the heat transfer gas supplied into the first gas line. The mounting table further includes a sleeve configured to connect the first gas line and the second gas line. At least a surface of the sleeve has insulating property, and the surface of the sleeve is made of ceramics. The base and the cooling table provide an accommodation space in which the sleeve is accommodated. The base has a surface which forms the accommodation space and a film made of insulating ceramics is formed on the surface of the base. The mounting table further includes a third elastic member which is an O-ring having insulating property and is configured to seal the accommodation space between the film and the cooling table. According to this exemplary embodiment, the gas line for the heat transfer gas supplied into the gap between the substrate and the attraction unit is formed without using the adhesive. Further, since the surface of the base forming the accommodation space for the sleeve is covered with the film of the insulating ceramics and the third elastic member having insulating property is provided between this film and the cooling table to seal the accommodation space hermetically, it is possible to suppress plasma from being introduced into a gap between the base and the cooling table, and also possible to suppress dielectric breakdown of the base caused by the introduction of the plasma.

The mounting table may further include a fourth elastic member. The fourth elastic member is an O-ring having insulating property, and is provided between the cooling table and the base at an outside of the third elastic member, and is configured to form the heat transfer space along with the first elastic member. The fourth elastic member may be made of perfluoroelastomer.

The clamping member may be made of titanium. Since the titanium has low thermal conductivity, the thermal conduction between the cooling table and the base via the clamping member can be suppressed.

The ceramics, by which the attraction unit is made, may be aluminum oxide. Since the aluminum oxide has high volume resistivity under a high temperature environment, a sufficient attracting force can be exerted by the attraction unit made of the aluminum oxide even at a high temperature larger than 200° C.

In another exemplary embodiment, there is provided a plasma processing apparatus. The plasma processing apparatus includes a processing vessel, a mounting table and a high frequency power supply. The mounting table is configured to support a substrate within the processing vessel, and is one of the mounting tables according to above-described various exemplary embodiments. The high frequency power supply is electrically connected to the power feed body of the mounting table.

The plasma processing apparatus may further include a heat transfer medium supply system configured to selectively supply the heat transfer gas or the coolant into the heat transfer space of the mounting table. In the plasma processing apparatus according to this exemplary embodiment, if the temperature of the electrostatic chuck is set to a high temperature, it is possible to supply the heat transfer gas (e.g., He gas) into the heat transfer space. Further, when decreasing the temperature of the electrostatic chuck, it is possible to supply the coolant into the heat transfer space. A speed of temperature decrease of the electrostatic chuck while supplying the coolant into the heat transfer space is higher than a speed of temperature decrease of the electrostatic chuck while supplying the heat transfer gas (e.g., He gas) into the heat transfer space. Accordingly, this plasma processing apparatus is suitable for cooling the temperature of the electrostatic chuck rapidly.

The coolant is a liquid phase coolant, and the heat transfer medium supply system includes a supply unit, a first tank, a first dry pump, a first to seventh lines, a first to sixth valves, a chiller unit, a second tank, a second dry pump, a first to sixth coolant lines, a first to fourth coolant valves. The supply unit is configured to supply the heat transfer gas into the heat transfer space. The first line has one end connected to the supply unit and the other end. The first valve is provided at a portion of the first line. The second line has one end connected to the other end of the first line and the other end connected to the heat transfer space. The second valve is provided at a portion of the second line. The third line has one end connected to the other end of the first line and the other end. The third valve is provided at a portion of the third line. The fourth line has one end connected to the other end of the first line and the other end connected to the other end of the third line. The fourth valve is provided at a portion of the fourth line. The fifth line has one end connected to the second line between the second valve and the heat transfer space and the other end connected to the first tank. The fifth valve is provided at a portion of the fifth line. The sixth line has one end connected to the first tank and the other end connected to the first dry pump. The sixth valve is provided at a portion of the sixth line. The seventh line has one end connected to the other end of the third line and the other end connected to the sixth line between the sixth valve and the first dry pump. The chiller unit is configured to supply the coolant. The first coolant line is configured to supply the coolant into the flow path of the cooling table, and is configured to connect the flow path of the cooling table and the chiller unit. The second coolant line is configured to collect the coolant from the flow path of the cooling table, and is configured to connect the flow path of the cooling table and the chiller unit. The third coolant line has one end connected to the heat transfer space and the other end. The fourth coolant line has one end connected to the heat transfer space and the other end connected to the other end of the third coolant line. The first coolant valve is provided at a portion of the first coolant line, and is configured to connect the chiller unit to the flow path of the cooling table or the third coolant line selectively. The second coolant valve is provided at a portion of the second coolant line, and is configured to connect the chiller unit to the flow path of the cooling table or the fourth coolant line selectively. The fifth coolant line has one end connected to the other end of the third coolant line and the other end connected to the second tank. The third coolant valve is provided at a portion of the fifth coolant line. The sixth coolant line is configured to connect the second tank and the second dry pump. The fourth coolant valve is provided at a portion of the sixth coolant line.

The plasma processing apparatus may further include a heater power supply for the heater and a controller configured to control the heat transfer medium supply system and the heater power supply.

(i) The controller is configured to control the heat transfer medium supply system and the heater power supply to create a state in which the first valve, the second valve and the fourth valve are opened; the third valve, the fifth valve and the sixth valve are closed; the first coolant valve and the second coolant valve allow the chiller unit and the flow path of the cooling table to be connected; the third coolant valve and the fourth coolant valve are closed; and the heater is set to be ON.

(ii) The controller is configured to control the heat transfer medium supply system and the heater power supply to create a state in which the first valve, the fourth valve, the fifth valve and the sixth valve are closed; the second valve and the third valve are opened; the first coolant valve and the second coolant valve allow the chiller unit and the flow path of the cooling table to be connected; the third coolant valve and the fourth coolant valve are closed; and the heater is set to be OFF.

(iii) The controller is configured to control the heat transfer medium supply system and the heater power supply to create a state in which the first valve, the second valve, the third valve, the fourth valve, the fifth valve and the sixth valve are closed; the first coolant valve and the second coolant valve allow the chiller unit and the heat transfer space to be connected; the third coolant valve and the fourth coolant valve are closed; and the heater is set to be OFF.

(iv) The controller is configured to control the heat transfer medium supply system and the heater power supply to create a state in which the first valve, the second valve, the third valve, the fourth valve, the fifth valve and the sixth valve are closed; the first coolant valve and the second coolant valve allow the chiller unit and the flow path of the cooling table to be connected; the third coolant valve and the fourth coolant valve are closed; and the heater is set to be OFF.

(v) The controller is configured to control the heat transfer medium supply system and the heater power supply to create a state in which the first valve, the second valve, the third valve and the fourth valve are closed; the fifth valve and the sixth valve are opened; the first coolant valve and the second coolant valve allow the chiller unit and the flow path of the cooling table to be connected; the third coolant valve and the fourth coolant valve are opened; and the heater is set to be OFF.

The coolant is a hydrofluorocarbon-based coolant, and the heat transfer medium supply system includes a supply unit, a first dry pump, a first to sixth lines, a first to fifth valves, a chiller unit, a first to fourth coolant lines and a first and second coolant valves. The supply unit is configured to supply the heat transfer gas into the heat transfer space. The first line has one end connected to the supply unit and the other end. The first valve is provided at a portion of the first line. The second line has one end connected to the other end of the first line and the other end connected to the heat transfer space. The second valve is provided at a portion of the second line. The third line has one end connected to the other end of the first line and the other end. The third valve is provided at a portion of the third line. The fourth line has one end connected to the other end of the first line and the other end connected to the other end of the third line. The fourth valve is provided at a portion of the fourth line. The fifth line has one end connected to the second line between the second valve and the heat transfer space and the other end connected to the first dry pump. The fifth valve is provided at a portion of the fifth line. The sixth line has one end connected to the other end of the third line and the other end connected to the fifth line between the fifth valve and the first dry pump. The chiller unit is configured to supply the coolant. The first coolant line is configured to supply the coolant into the flow path of the cooling table, and is configured to connect the flow path of the cooling table and the chiller unit. The second coolant line is configured to collect the coolant from the flow path of the cooling table, and is configured to connect the flow path of the cooling table and the chiller unit. The third coolant line has one end connected to the heat transfer space. The fourth coolant line has one end connected to the heat transfer space. The first coolant valve is provided at a portion of the first coolant line, and is configured to connect the chiller unit to the flow path of the cooling table or the third coolant line selectively. The second coolant valve is provided at a portion of the second coolant line, and is configured to connect the chiller unit to the flow path of the cooling table or the fourth coolant line selectively.

The plasma processing apparatus may further include a heater power supply for the heater; and a controller configured to control the heat transfer medium supply system and the heater power supply.

(i) The controller is configured to control the heat transfer medium supply system and the heater power supply to create a state in which the first valve, the second valve and the fourth valve are opened; the third valve and the fifth valve are closed; the first coolant valve and the second coolant valve allow the chiller unit and the flow path of the cooling table to be connected; and the heater is set to be ON.

(ii) The controller is configured to control the heat transfer medium supply system and the heater power supply to create a state in which the first valve, the fourth valve and the fifth valve are closed; the second valve and the third valve are opened; the first coolant valve and the second coolant valve allow the chiller unit and the flow path of the cooling table to be connected; and the heater is set to be OFF.

(iii) The controller is configured to control the heat transfer medium supply system and the heater power supply to create a state in which the first valve, the second valve, the third valve, the fourth valve and the fifth valve are closed; the first coolant valve and the second coolant valve allow the chiller unit and the heat transfer space to be connected; and the heater is set to be OFF.

(iv) The controller is configured to control the heat transfer medium supply system and the heater power supply to create a state in which the first valve, the second valve, the third valve, the fourth valve and the fifth valve are closed; the first coolant valve and the second coolant valve allow the chiller unit and the flow path of the cooling table to be connected; and the heater is set to be OFF.

(v) The controller is configured to control the heat transfer medium supply system and the heater power supply to create a state in which the first valve, the second valve, the third valve and the fourth valve are closed; the fifth valve is opened; the first coolant valve and the second coolant valve allow the chiller unit and the flow path of the cooling table to be connected; and the heater is set to be ON.

According to the exemplary embodiments as stated above, the mounting table, having a structure in which the electrostatic chuck is spaced apart from the cooling table, is provided with the power feed route for supplying the high frequency power to the base of the electrostatic chuck. Further, the loss of the high frequency power in this power feed route is suppressed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
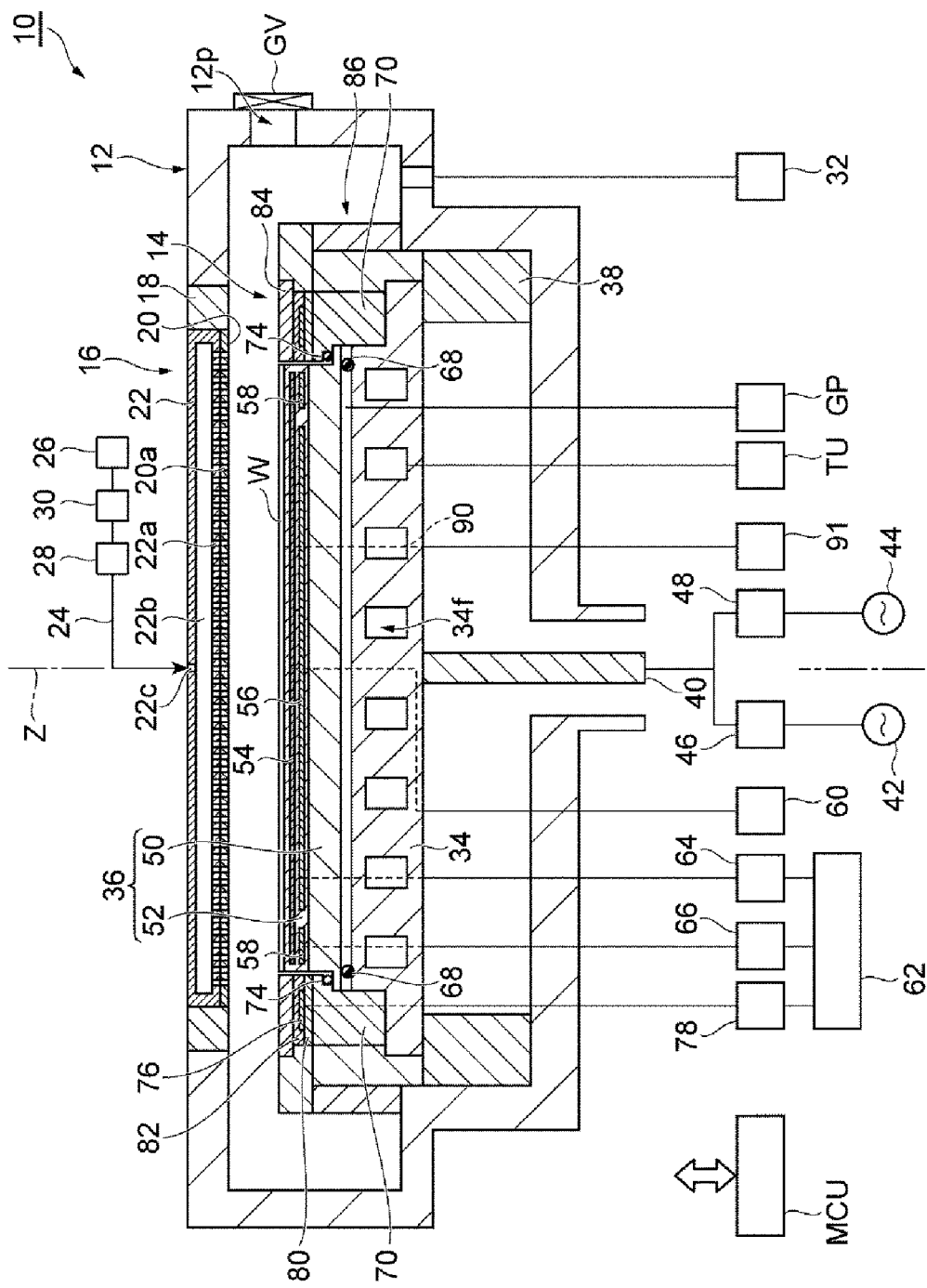
FIG. 1 is a diagram schematically illustrating a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a diagram schematically illustrating a plasma processing apparatus according to an exemplary embodiment. The plasma processing apparatus 10 shown in FIG. 1 is configured as a capacitively coupled plasma processing apparatus and is equipped with a processing vessel 12 and a mounting table 14. The processing vessel 12 has a substantially cylindrical shape and is provided with an internal space in which a plasma process is performed. The processing vessel 12 is made of, by way of non-limiting example, aluminum. An alumite film and/or a film made of ceramics such as yttrium oxide having plasma resistance is formed on a surface of the processing vessel 12 at the side of the internal space thereof. This processing vessel 12 is grounded. Further, an opening 12p through which a substrate (hereinafter, referred to as "wafer W") is carried into/out of the processing vessel 12 is formed at a sidewall of the processing vessel 12. This opening 12p is opened or closed by a gate valve GV.

The mounting table 14 is configured to support the wafer W in the internal space of the processing vessel 12. The mounting table 14 has a function of attracting the wafer W and a function of adjusting a temperature of the wafer W, and is configured to transmit a high frequency power to a base of an electrostatic chuck. Details of this mounting table 14 will be explained later.

The plasma processing apparatus 10 is further equipped with an upper electrode 16. The upper electrode 16 is provided in a top opening of the processing vessel 12 and is disposed substantially in parallel with a lower electrode of the mounting table 14 to be described later. An insulating supporting member 18 is provided between the upper electrode 16 and the processing vessel 12.

The upper electrode 16 includes a ceiling plate 20 and a supporting body 22. The ceiling plate 20 has a substantially disk shape and may have conductivity. The ceiling plate 20 is made of, by way of non-limiting example, silicon. Alternatively, the ceiling plate 20 may be made of aluminum, and a film of ceramics having plasma resistance may be formed on a surface of this ceiling plate 20. Further, the ceiling plate 20 is provided with gas discharge holes 20a. The gas discharge holes 20a are extended in a substantially vertical direction.

The supporting body 22 is configured to support the ceiling plate 20 in a detachable manner, and is made of, but not limited to, aluminum. A gas diffusion space 22b is formed within the supporting body 22. Communication holes 22a are extended from the gas diffusion space 22b, and these communication holes 22a communicate with the gas discharge holes 20a, respectively. Further, a line 24 is connected to the gas diffusion space 22b via a port 22c. This line 24 is connected to a gas supply source 26. Further, a flow rate controller 28 such as a mass flow controller and a valve 30 are provided at portions of the line 24.

Further, the plasma processing apparatus 10 is further equipped with a gas exhaust device 32. The gas exhaust device 32 includes one or more pumps such as a turbo molecular pump or a dry pump; and a pressure control valve. This gas exhaust device 32 is connected to a gas exhaust opening formed at the processing vessel 12.

Furthermore, the plasma processing apparatus 10 further includes a controller MCU. The controller MCU is configured to control individual components of the plasma processing apparatus 10. By way of example, the controller MCU may be a computer device which is equipped with a processor and a storage device such as a memory. The controller MCU is operated according to a program and a recipe stored in the storage device, so that the individual components of the plasma processing apparatus 10 can be controlled.

When this plasma processing apparatus 10 is operated, the wafer W is mounted and held by the mounting table 14. Further, a processing gas from the gas supply source 26 is supplied into the processing vessel 12, and the gas exhaust device 32 is operated so that the internal space of the processing vessel 12 is decompressed. Further, a high frequency electric field is formed between the upper electrode 16 and the lower electrode of the mounting table 14. Accordingly, the processing gas is dissociated, and the wafer W is processed by active species of molecular and/or atoms in the processing gas. In this processing, the individual components of the plasma processing apparatus 10 are controlled by the controller MCU.

Figure 2:
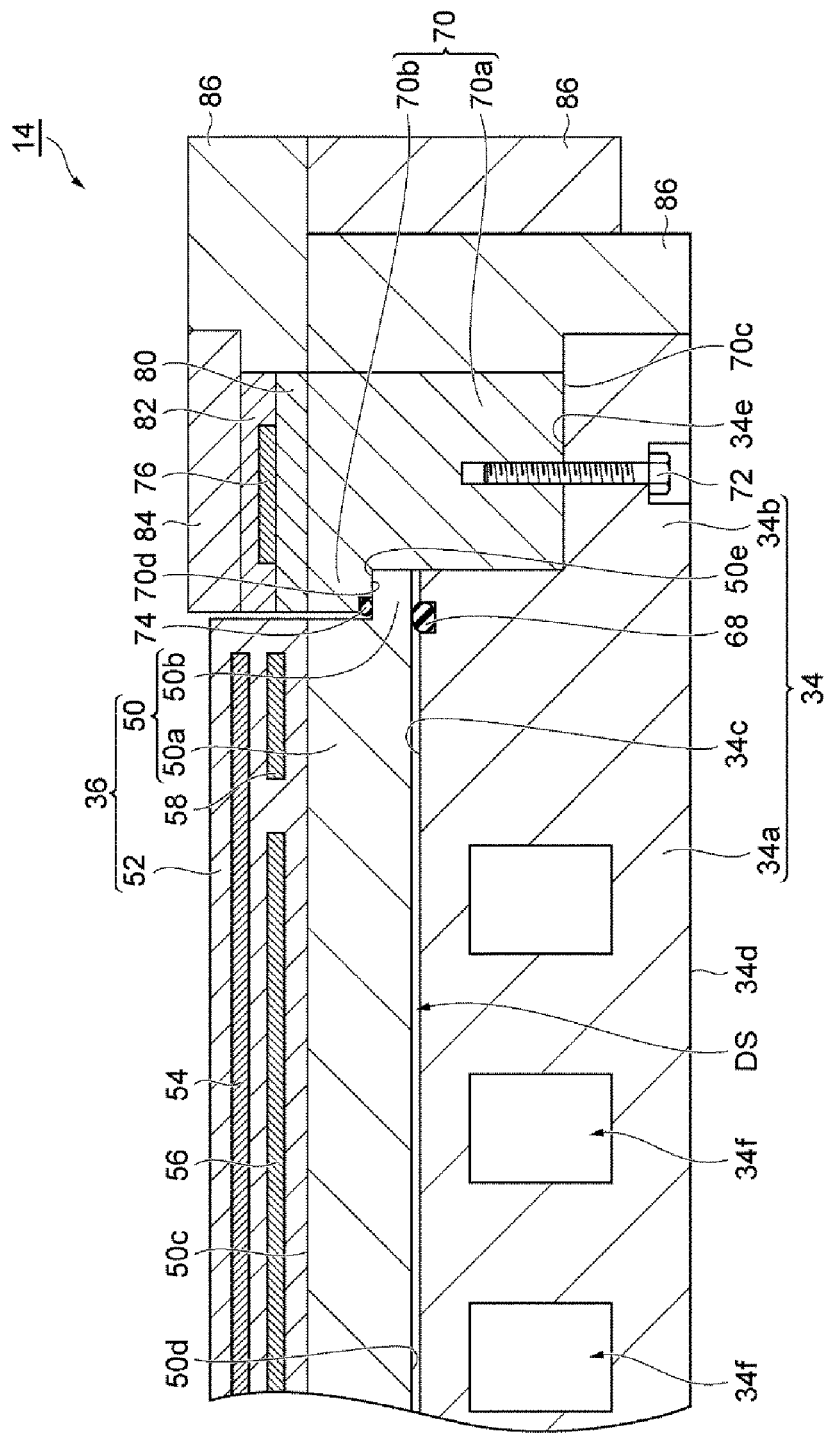
FIG. 2 is an enlarged cross sectional view illustrating a part of a mounting table of the plasma processing apparatus shown in FIG. 1.
Figure 3:
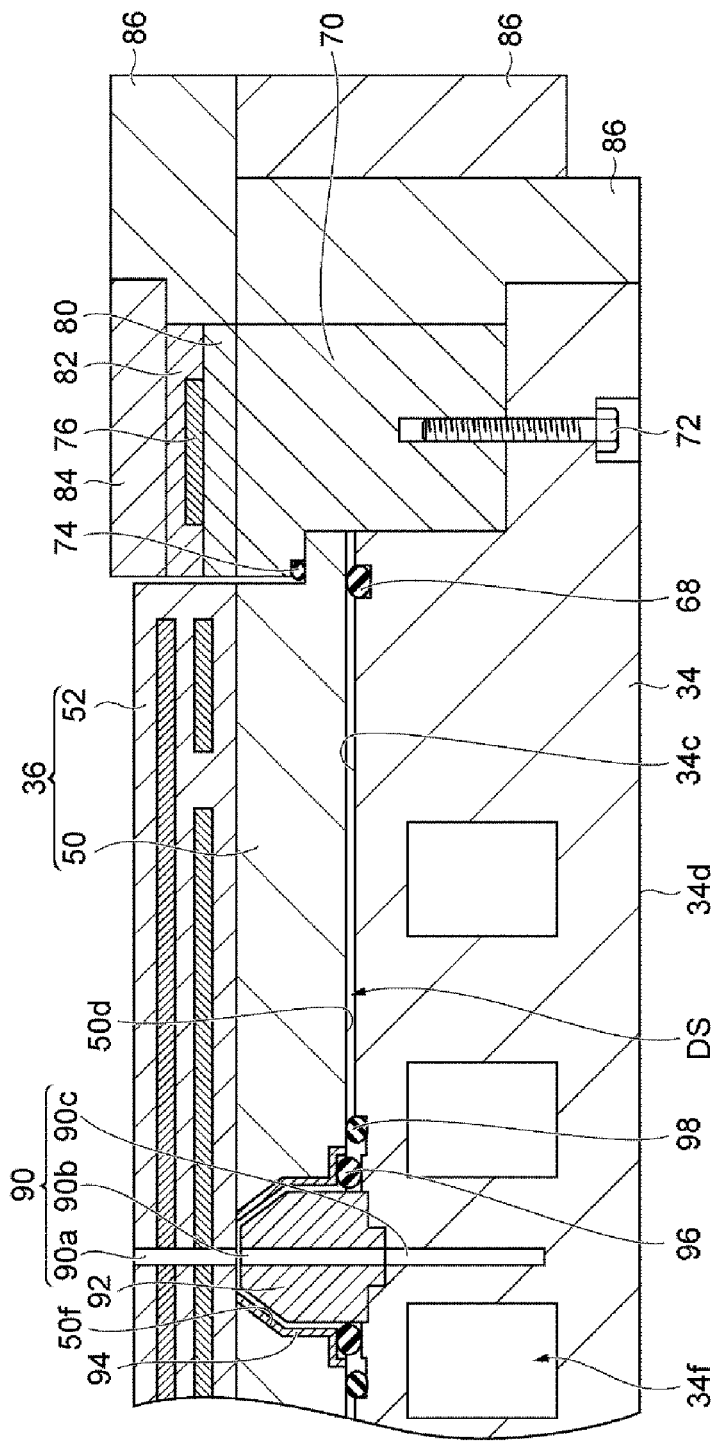
FIG. 3 is an enlarged cross sectional view illustrating another part of the mounting table of the plasma processing apparatus shown in FIG. 1.

Now, referring to FIG. 2 and FIG. 3 as well as FIG. 1, the mounting table 14 and constituent components of the plasma processing apparatus 10 belonging to the mounting table 14 will be elaborated. FIG. 2 is an enlarged cross sectional view illustrating a part of the mounting table of the plasma processing apparatus shown in FIG. 1, and FIG. 3 is an enlarged cross sectional view illustrating another part of the mounting table of the plasma processing apparatus shown in FIG. 1.

The mounting table 14 includes a cooling table 34 and an electrostatic chuck 36. The cooling table 34 is supported by a supporting member 38 which is extended from a bottom portion of the processing vessel 12. The supporting member 38 is an insulating member, and is formed of, by way of example, but not limitation, aluminum oxide (alumina). Further, the supporting member 38 has a substantially cylindrical shape.

The cooling table 34 is made of a conductive metal such as, but not limited to, aluminum. The cooling table 34 has a substantially disk shape. The cooling table 34 has a central portion 34a, i.e., a first central portion and a peripheral portion 34b, i.e., a first peripheral portion. The central portion 34a has a substantially disk shape. The central portion 34a provides a first top surface 34c of the cooling table 34. The first top surface 34c is a substantially circular surface.

The peripheral portion 34b is continuous with the central portion 34a and is extended in a circumferential direction (i.e., a circumferential direction with respect to an axis line Z which is extended in a vertical direction) at an outside of the central portion 34a in a diametric direction (i.e. a radial direction with respect to the axis line Z). In the exemplary embodiment, the peripheral portion 34b along with the central portion 34a provides a bottom surface 34d of the cooling table 34. Further, the peripheral portion 34b provides a second top surface 34e. The second top surface 34e is a strip-shaped surface and is extended in the circumferential direction at an outside of the first top surface 34c in the diametric direction. Furthermore, the second top surface 34e is located closer to the bottom surface 34d than to the first top surface 34c in the vertical direction.

The cooling table 34 is connected with a power feed body 40. In the exemplary embodiment, the power feed body 40 is a power feed rod and is connected to the bottom surface 34d of the cooling table 34. The power feed body 40 is made of aluminum or an aluminum alloy.

The power feed body 40 is electrically connected with a high frequency power supply 42 and a high frequency power supply 44 which are provided at an outside of the processing vessel 12. The high frequency power supply 42 is a power source configured to generate a first high frequency power for plasma generation. A frequency of the first high frequency power is, for example, 40 MHz. The high frequency power supply 44 is a power source configured to generate a second high frequency power for ion attraction. A frequency of the second high frequency power is, for example, 13.56 MHz.

The high frequency power supply 42 is connected to the power feed body 40 via a matching device 46. The matching device 46 is equipped with a matching circuit which is configured to match an impedance at a load side of the high frequency power supply 42 with an output impedance of the high frequency power supply 42. The high frequency power supply 44 is connected to the power feed body 40 via a matching device 48. The matching device 48 is equipped with a matching circuit which is configured to match an impedance at a load side of the high frequency power supply 44 with an output impedance of the high frequency power supply 44.

The cooling table 34 is provided with a flow path 34f for a coolant. For example, the flow path 34f is extended in a spiral shape within the cooling table 34. The coolant is supplied into the flow path 34f by a chiller unit TU. The coolant supplied into the flow path 34f is a liquid phase coolant which exists as a liquid within a working temperature range of the plasma processing apparatus 10, for example, within a temperature range from 20° C. to 250° C. Alternatively, the coolant may be of a type which performs cooling by absorbing heat as it is vaporized. By way of example, the coolant may be a hydrofluorocarbon-based coolant.

The electrostatic chuck 36 is provided on the cooling table 34. To elaborate, the electrostatic chuck 36 is provided on the first top surface 34c of the cooling table 34. The electrostatic chuck 36 has a base 50 and an attraction unit 52. The base 50 is configured as the lower electrode, and is provided on the cooling table 34. The base 50 has conductivity. Further, the base 50 may be made of, by way of non-limiting example, ceramics which is prepared by providing conductivity to aluminum nitride or silicon carbide, or may be made of a metal (e.g., titanium).

The base 50 has a substantially disk shape, and is provided with a central portion 50a, i.e., a second central portion and a peripheral portion 50b, i.e., a second peripheral portion. The central portion 50a has a substantially disk shape. The central portion 50a provides a first top surface 50c of the base 50. The first top surface 50c is a substantially circular surface.

The peripheral portion 50b is continuous with the central portion 50a, and is extended in the circumferential direction at an outside of the central portion 50a in the diametric direction. In the exemplary embodiment, the peripheral portion 50b along with the central portion 50a provides a bottom surface 50d of the base 50. Further, the peripheral portion 50b provides a second top surface 50e. The second top surface 50e is a strip-shaped surface and is extended in the circumferential direction at an outside of the first top surface 50c in the diametric direction. Furthermore, the second top surface 50e is located closer to the bottom surface 50d than to the first top surface 50c in the vertical direction.

The attraction unit 52 is disposed on the base 50, and is fastened to the base 50 by metal bonding using a metal which is provided between the attraction unit 52 and the base 50. The attraction unit 52 has a substantially disk shape, and is made of ceramics. The ceramics forming the attraction unit 52 may have volume resistivity equal to or higher than $1 \times 10^{15}$ Ω·cm within a temperature range from a room temperature (e.g., 20° C.) to 400° C. By way of non-limiting example, aluminum oxide (alumina) may be used as such ceramics. The attraction unit 52 made of the ceramics having the volume resistivity within the above-specified range is capable of exerting a sufficient attracting force even at a high temperature larger than 200° C.

The attraction unit 52 includes therein an attraction electrode 54, a heater 56 and a heater 58. The attraction electrode 54 is an electrode film and is electrically connected with a DC power supply 60. If a DC voltage is applied to the attraction electrode 54 from the DC power supply 60, the attraction unit 52 generates an electrostatic force such as a Coulomb force to hold the wafer W by the electrostatic force.

The heater 56 is located at a center side of the attraction unit 52 more than the heater 58. That is, the heater 58 is provided in a peripheral region of the attraction unit 52, and the heater 56 is provided at an inside of the heater 58. The heater 56 and the heater 58 are electrically connected to a heater power supply 62. The heater power supply 62 is a triple-system power supply. A filter 64 is provided between the heater 56 and the heater power supply 62 to suppress the high frequency power from being introduced into the heater power supply 62. Further, a filter 66 is provided between the heater 58 and the heater power supply 62 to suppress the high frequency power from being introduced into the heater power supply 62.

An elastic member 68, i.e., a first elastic member is provided between the base 50 and the cooling table 34. By the elastic member 68, the electrostatic chuck 36 is spaced apart from the cooling table 34 in an upward direction. The elastic member 68 may be implemented by an O-ring. The elastic member 68 is partially arranged within a groove which is formed by the first top surface 34c of the cooling table 34, and is in contact with the first top surface 34c and the bottom surface 50d of the base 50. Further, the elastic member 68 forms, along with the cooling table 34 and the base 50, a heat transfer space DS between the first top surface 34c of the cooling table 34 and the bottom surface 50d of the base 50. Furthermore, the elastic member 68 serves to hermetically seal the heat transfer space DS between the cooling table 34 and the base 50. A heat transfer gas such as, but not limited to, a He gas is supplied into the heat transfer space DS from a supply unit GP.

A length of the heat transfer space DS in the vertical direction depends on a set temperature range of the electrostatic chuck 36 which is set when the plasma processing apparatus 10 is operated. By way of example, but not limitation, the length of the heat transfer space DS in the vertical direction may be set to be within a range from 0.1 mm to 2.0 mm. As an example, in case that the set temperature range of the electrostatic chuck 36 is equal to or higher than 80° C. and equal to or lower than 250° C., the length of the heat transfer space DS in the vertical direction is set to be 0.5 mm. Further, in case that a lower limit of the set temperature range of the electrostatic chuck 36 is lower than 80° C., the length of the heat transfer space DS in the vertical direction is set to be shorter than 0.5 mm.

In the exemplary embodiment, the elastic member 68 is configured to have thermal resistance higher than thermal resistance of the heat transfer space DS while the He gas is being supplied into the heat transfer space DS. The thermal resistance of the heat transfer space DS relies on thermal conductivity of the heat transfer gas, the length of the heat transfer space DS in the vertical direction and an area of the heat transfer space DS. Further, the thermal resistance of the elastic member 68 depends on thermal conductivity of the elastic member 68, a thickness of the elastic member 68 in the vertical direction and an area of the elastic member 68. Accordingly, the material, the thickness and the area of the elastic member 68 are determined based on the thermal resistance of the heat transfer space DS. Furthermore, the elastic member 68 is required to have low thermal conductivity and high thermal resistivity. This elastic member 68 may be made of, by way of non-limiting example, perfluoroelastomer.

The mounting table 14 is further equipped with a clamping member 70. The clamping member 70 is made of a metal, and is configured to interpose the base 50 and the elastic members 68 between the cooling table 34 and the clamping member 70. In the exemplary embodiment, in order to suppress thermal conduction from the clamping member 70 between the base 50 and the cooling plate 34, the clamping member 70 is made of a material having low thermal conductivity, for example, titanium.

In the exemplary embodiment, the clamping member 70 includes a cylindrical portion 70a and an annular portion 70b. The cylindrical portion 70a has a substantially cylindrical shape, and provides a first bottom surface 70c at a bottom end thereof. The first bottom surface 70c is a strip-shaped surface which is extended in the circumferential direction.

The annular portion 70b has a substantially annular plate shape, and is inwardly extended from the cylindrical portion 70a in the diametric direction while being continuous with an inner circumference of a top portion of the cylindrical portion 70a. This annular portion 70b provides a second bottom surface 70d. The second bottom surface 70d is a strip-shaped surface which is extended in the circumferential direction.

The clamping member 70 is disposed such that the first bottom surface 70c is in contact with the second top surface 34e of the cooling table 34 and the second bottom surface 70d is in contact with the second top surface 50e of the base 50. Further, the clamping member 70 is fixed to the peripheral portion 34b of the cooling table 34 by a screw 72. By adjusting the screwing of the screw 72 into the clamping member 72, a pressing amount of the elastic members 68 is adjusted. As a result, the length of the heat transfer space DS in the vertical direction can be adjusted.

In the exemplary embodiment, an elastic member 74, i.e., a second elastic member is provided between a bottom surface of an inner circumferential portion of the annular portion 70b of the clamping member 70 and the second top surface 50e of the base 50. The elastic member 74 is implemented by an O-ring, and serves to suppress a particle (for example, metal powder), which might be caused by friction between the second bottom surface 70d of the clamping member 70 and the second top surface 50e of the base 50, from moving toward the attraction unit 52.

Further, the elastic member 74 generates a reaction force smaller than a reaction force generated by the elastic members 68. In other words, the elastic member 68 is configured to generate the reaction force larger than the reaction force generated by the elastic member 74. Further, the elastic member 74 may be made of a material having a high thermal resistivity and a low thermal conductivity, such as, but not limited to, perfluoroelastomer.

A heater 76 is provided on the clamping member 70. The heater 76 is extended in the circumferential direction and is connected to the heater power supply 62 via a filter 78. The filter 78 is provided to suppress the high frequency power from being introduced into the heater power supply 62.

The heater 76 is disposed between a first film 80 and a second film 82. The first film 80 is provided between the second film 82 and the clamping member 70. The first member 80 has thermal conductivity lower than thermal conductivity of the second film 82. By way of non-limiting example, the first film 80 may be a thermally sprayed film of zirconia, and the second film 82 may be a thermally sprayed film of yttrium oxide (yttria). Further, the heater 76 may be a thermally sprayed film of tungsten.

A focus ring 84 is provided on the second film 82. The focus ring 84 is heated by heat from the heater 76. Further, most of a heat flux from the heater 76 faces toward the second film 82 rather than the first film 80 and flows toward the focus ring 84 via the second film 82. Accordingly, the focus ring 84 is efficiently heated.

Further, the cooling table 34, the clamping member 70 and so forth of the mounting table 14 are covered with one or more insulating members 86 at outer surfaces thereof. The one or more insulating members 86 are made of, by way of non-limiting example, aluminium oxide or quartz.

Furthermore, as depicted in FIG. 3, the cooling table 34 and the electrostatic chuck 36 of the mounting table 14 are equipped with a gas line 90 for supplying the heat transfer gas (for example, He gas) into a gap between the wafer W and the attraction unit 52. The gas line 90 is connected to a supply unit 91 of the heat transfer gas.

As illustrated in FIG. 3, the gas line 90 includes a gas line 90a (first gas line), a gas line 90b and a gas line 90c (second gas line). The gas line 90a is formed within the attraction unit 52. The gas line 90c is formed within the cooling table 34. The gas line 90a and the gas line 90c are connected to each other via the gas line 90b. The gas line 90b is provided by a sleeve 92. The sleeve 92 is a substantially cylindrical member, and at least a surface of the sleeve 92 has insulating property, and is made of ceramics. As an example, the sleeve 92 is made of insulating ceramics. By way of example, the sleeve 92 is made of aluminium oxide (alumina). As another example, the sleeve 92 may be a metal member whose surface is insulated. For example, the sleeve 92 may have a main body made of aluminium and an alumite film provided on a surface of the main body.

The base 50 and the cooling table 34 provide an accommodation space for accommodating the sleeve 92 therein. A film 94 of insulating ceramics is formed on a surface 50f of the base 50, which forms this accommodation space. The film 94 may be, by way of example, but not limitation, a thermally sprayed film of aluminium oxide (alumina).

An elastic member 96 for sealing the accommodation space of the sleeve 92, i.e., a third elastic member is provided between the film 94 and the cooling table 34. The elastic member 96 is an O-ring, and has insulating property. The elastic member 96 may be made of, by way of non-limiting example, perfluoroelastomer. Further, an elastic member 98, i.e., a fourth elastic member is provided at an outside of the elastic members 96. The elastic member 98 is an O-ring as well, and is in contact with the first top surface 34c of the cooling table 34 and the bottom surface 50d of the base 50. The elastic member 98 serves to seal the heat transfer space DS hermetically. The elastic member 98 may be made of, but not limited to, perfluoroelastomer.

As stated above, in the mounting table 14, the cooling table 34 and the base 50 are spaced apart from each other by the elastic member 68. Further, in this mounting table 14, no adhesive is used in bonding the base 50 and the attraction unit 52. Accordingly, the temperature of the electrostatic chuck 36 can be set to a high temperature of, e.g., 250° C. which exceeds 200° C. Furthermore, since heat exchange between the electrostatic chuck 36 and the mounting table 34 can be made via the heat transfer gas which is supplied into the heat transfer space DS, the temperature of the electrostatic chuck 36 can also be set to a low temperature (e.g., 80° C.). In addition, in this mounting table 14, the power feed body 40, the cooling table 34 and the clamping member 70 constitute a power feed route for supplying the high frequency power to the base 50 of the electrostatic chuck 36. Further, the power feed body 40 is not directly connected to the base 50 of the electrostatic chuck 36 but connected to the cooling table 34, it is possible to use aluminium or an aluminium alloy as a material for the power feed body 40. Therefore, even when a high frequency power having a high frequency equal to or higher than 13.56 MHz, a loss of the high frequency power in the power feed body 40 is suppressed.

In addition, in the exemplary embodiment as discussed above, the elastic member 74 is disposed between the bottom surface of the inner circumferential portion of the annular portion 70b of the clamping member 70 and the second top surface 50e of the base 50. Since the second top surface 50e of the peripheral portion 50b of the base 50 and the second bottom surface 70d of the clamping member 70 are in contact with each other, friction may be generated at a contact portion therebetween, so that a particle (e.g., metal powder) can be generated. Even in case that such a particle is generated, the elastic member 74 is capable of suppressing the particle from adhering to the attraction unit 52 and the wafer W which is mounted on the attraction unit 52.

Moreover, the elastic member 68 is configured such that the reaction force generated by the elastic member 68 is larger than the reaction force generated by the elastic member 74. Accordingly, the electrostatic chuck 36 can be spaced apart from the cooling table 34 securely.

Furthermore, in the exemplary embodiment, the elastic member 68 is configured to have the thermal resistance higher than the thermal resistance of the heat transfer space DS while the He gas is being supplied into the heat transfer space DS. Further, the elastic member 68 may be made of, by way of non-limiting example, perfluoroelastomer. With this elastic member 68, between the electrostatic chuck 36 and the cooling table 34, the thermal conduction through the heat transfer space DS becomes more dominant than the thermal conduction through the elastic members 68. Thus, the temperature distribution of the electrostatic chuck 36 can be uniform.

Moreover, in the exemplary embodiment, the gas line 90 for the heat transfer gas which is supplied into the gap between the wafer W and the attraction unit 52 is formed without using the adhesive. Further, the surface 50*f* of the base 50 forming the accommodation space in which the sleeve 92 forming a part of the gas line 90 is accommodated is covered with the film 94, and the insulating elastic member 96 is provided between the film 94 and the cooling table 34 to seal the accommodation space. With this configuration, it is possible to suppress plasma from being introduced into the gap between the base 50 and the cooling table 34, and also suppress dielectric breakdown of the base 50 caused by the introduction of the plasma.

Further, with the plasma processing apparatus 10 having the above-described mounting table 14, a plasma processing can be performed on the wafer W in a temperature range from a low temperature of 80° C. or less to a high temperature of, e.g., 250° C. larger than 200° C.

Figure 4:
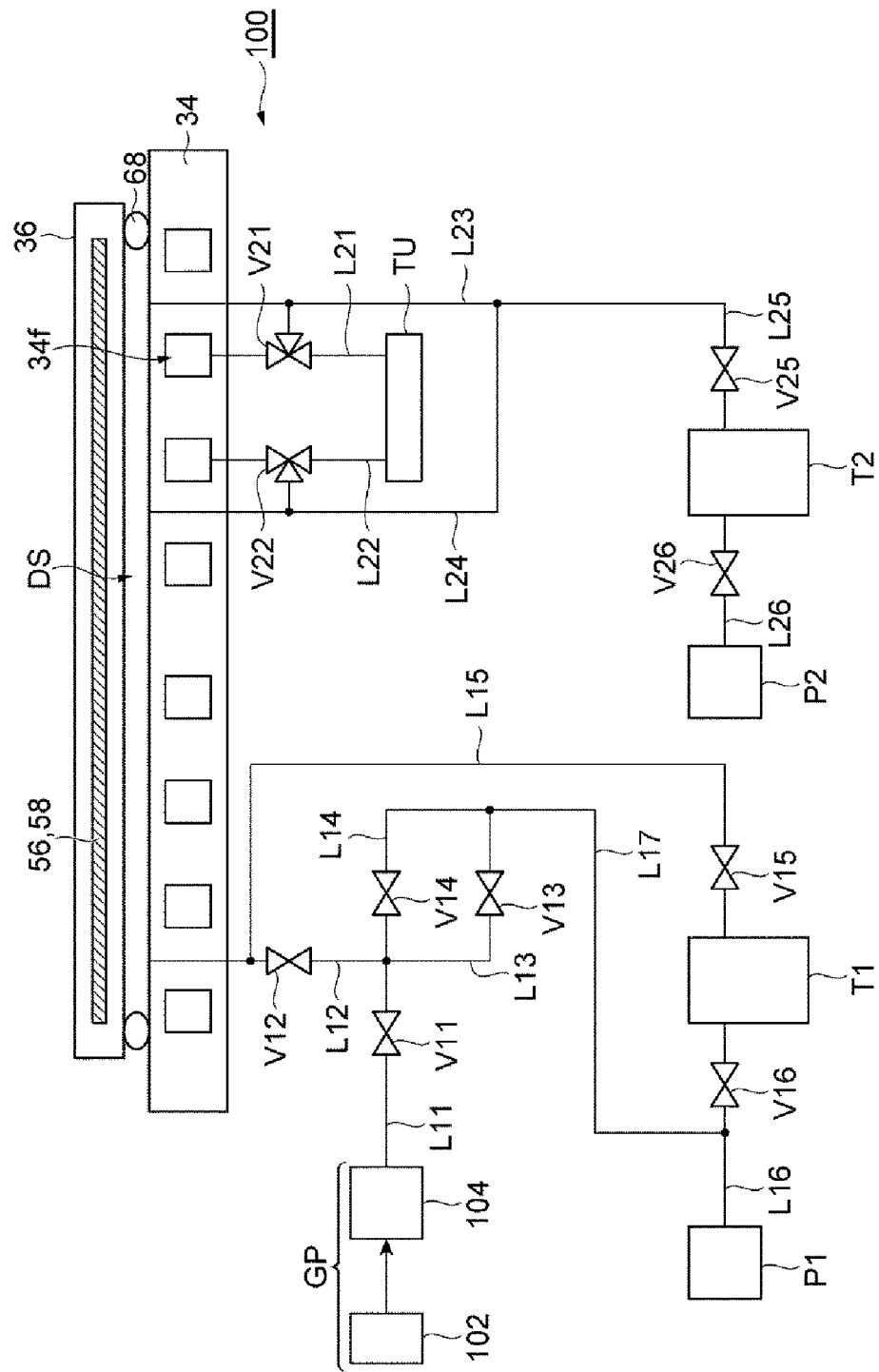
FIG. 4 is a diagram illustrating a configuration of a heat transfer medium supply system according to the exemplary embodiment.

Now, a heat transfer medium supply system which can be employed in the plasma processing apparatus 10 will be explained. The heat transfer medium supply system is a device configured to selectively supply a heat transfer gas or a coolant into the heat transfer space DS. FIG. 4 is a diagram illustrating a configuration of the heat transfer medium supply system according to the exemplary embodiment.

The heat transfer medium supply system 100 shown in FIG. 4 includes the supply unit GP and the chiller unit TU mentioned above. The supply unit GP is equipped with a supply source 102 for a heat transfer gas (e.g., He gas) and a pressure controller 104. The heat transfer gas from the supply source 102 is supplied via the pressure controller 104. A pressure of the heat transfer gas is adjusted by the pressure controller 104. In the heat transfer medium supply system 100, the chiller unit TU is configured as a chiller unit which uses a liquid phase coolant, and this liquid phase coolant is, for example, a fluorine-based liquid phase coolant. The heat transfer medium supply system 100 equipped with the chiller unit TU using the liquid phase coolant further includes a line L11 (first line), a line L12, a line L13, a line L14, a line L15, a line L16, a line L17, a valve V11, a valve V12, a valve V13, a valve V14, a valve V15, a valve V16, a line L21, a line L22, a line L23, a line L24, a line L25, a line L26, a valve V21, a valve V22, a valve V25, a valve V26, a tank T1, a tank T2, a dry pump P1 and a dry pump P2.

One end of the line L11 is connected to the pressure controller 104. The valve V11 is provided at a portion of the line L11. The other end of the line L11 is connected with one end of the line L12, one end of the line L13 and one end of the line L14. The valve V12 is provided at a portion of the line L12; the valve V13 is provided at a portion of the line L13; and the valve V14 is provided at a portion of the line L14.

The other end of the line L12 is connected to the heat transfer space DS. One end of the line L15 is connected to the line L12 between the heat transfer space DS and the valve V12. The valve V15 is provided at a portion of the line L15. The line L15 is connected to the tank T1 at a downstream side of the valve V15. That is, the other end of the line L15 is connected to the tank T1. The tank T1 is connected with one end of the line L16, and the valve V16 is provided at a portion of the line L16. Further, the dry pump P1 is provided at a downstream side of the line L16. That is, the other end of the line L16 is connected to the dry pump P1.

The line L13 and the line L14 join each other at the other ends thereof. The other end of the line L13 and the other end of the line L14 are connected with one end of the line L17. The other end of the L17 is connected to the line L16 between the valve V16 and the dry pump P1.

The chiller unit TU is connected to the flow path 34*f* via the line L21. That is, one end of the line L21 is connected to the chiller unit TU, and the other end of the line L21 is connected to the flow path 34*f*. The line L21 is a line for supplying a coolant into the flow path 34*f*. Further, the chiller unit TU is connected to the flow path 34*f* via the line L22 as well. That is, one end of the line L22 is connected to the chiller unit TU, and the other end of the line L22 is connected to the flow path 34*f*. This line L22 is a line for collecting the coolant from the flow path 34*f*. The valve V21 is provided at a portion of the line L21, and the valve V22 is provided at a portion of the line L22. The line L23 is connected to the valve V21, and the line L24 is connected to the valve V22. One end of the line L23 and one end of the line L24 are connected to the heat transfer space DS. The valve V21 is configured to connect the chiller unit TU to either one of the flow path 34*f* and the line L23 selectively. The valve V22 is configured to connect the chiller unit TU to either one of the flow path 34*f* and the line L24 selectively. The valve V21 and the valve V22 are, for example, three-way valves. Further, the other end of the line L23 and the other end of the line L24 join each other, and the other end of the line L23 and the other end of the line L24 are connected with one end of the line L25. The valve V25 is provided at a portion of the line L25. Further, the line L25 is connected to the tank T2 at a downstream side of the valve V25. That is, the other end of the line L25 is connected to the tank T2. One end of the line L26 is connected to the tank T2, and the valve V26 is provided at a portion of the line L26. Further, the dry pump P2 is provided at a downstream side of the line L26. That is, the other end of the line L26 is connected to the dry pump P2.

Hereinafter, an operation of the heat transfer medium supply system 100 when decreasing the temperature of the electrostatic chuck 36 will be explained with reference to FIG. 5 to FIG. 9. In the operation described below, the heat transfer medium supply system 100 and the heater power supply 62 are controlled by the controller MCU. Further, in FIG. 5 to FIG. 9, the heater 56 and the heater 58 marked by black color are in an ON state, that is, in a state where electric current is being supplied to these heaters. Meanwhile, the heater 56 and the heater 58 marked by white color are in an OFF state. Further, the valves marked by white color are in an open state, whereas the valves marked by black color are in a closed state.

Figure 5:
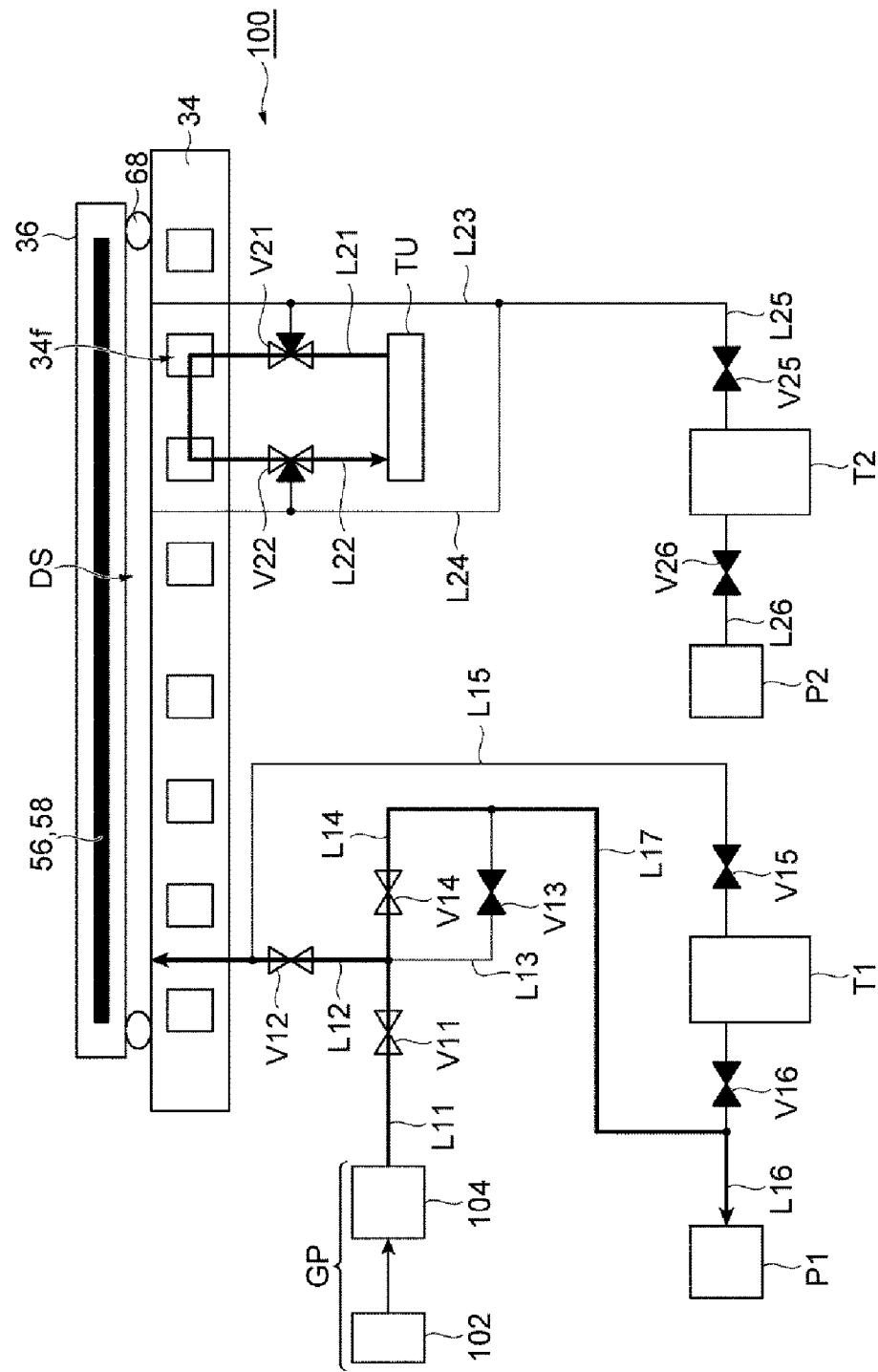
FIG. 5 is a diagram for describing an operation of the heat transfer medium supply system shown in FIG. 4.

First, as depicted in FIG. 5, in the state where the heater 56 and the heater 58 are ON, that is, in the state where the electrostatic chuck 36 is heated, the valve V11, the valve V12 and the valve V14 are set to be open, and the valve V13, the valve V15 and the valve V16 are set to be closed. Further, the valve V25 and the valve V26 are set to be closed. Furthermore, the valve V21 and the valve V22 are set to allow the chiller unit TU and the flow path 34*f* to communicate with each other. In addition, the valve V21 is set to be closed to the line L23, and the valve V22 is set to be closed to the line L24. Accordingly, the heat transfer gas from the supply unit GP is supplied into the heat transfer space DS. Further, the coolant is circulated between the chiller unit TU and the flow path 34*f*.

Figure 6:
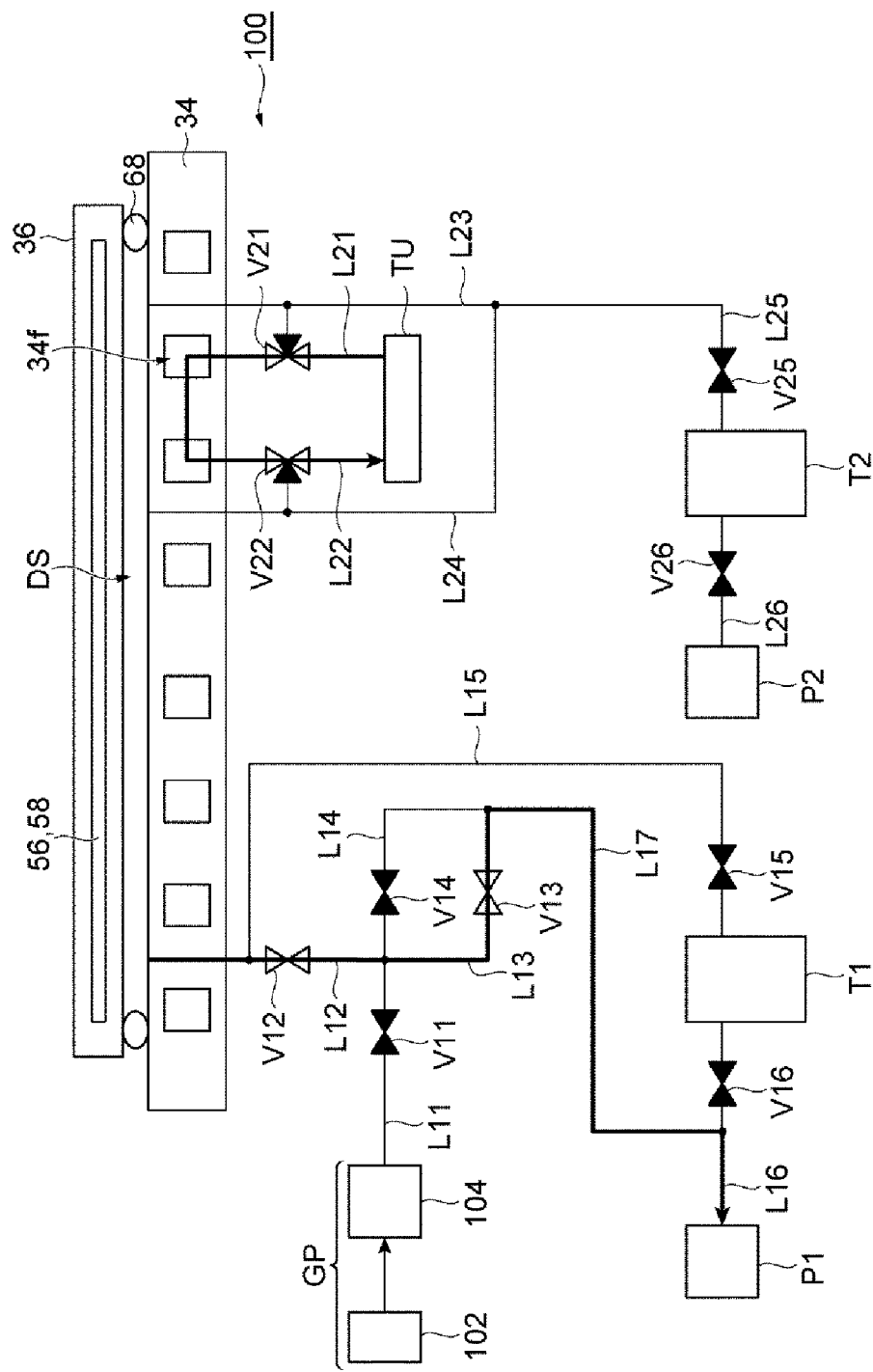
FIG. 6 is a diagram for describing the operation of the heat transfer medium supply system shown in FIG. 4.

From the state shown in FIG. 5, to decrease the temperature of the electrostatic chuck 36, the heater 56 and the heater 58 are set to be OFF, as depicted in FIG. 6. Further, the valve V12 and the valve V13 are set to be open, and the valve V11, the valve V14, the valve V15 and the valve V16 are set to be closed. Furthermore, the valve V25 and the valve V26 are set to be closed. In addition, the valve V21 and the valve V22 are set to be in the state where the chiller unit TU and the flow path 34f communicate with each other. Furthermore, the valve V21 is set to be closed to the line L23, and the valve V22 is set to be closed to the line L24. Accordingly, the heat transfer gas is flown into the dry pump P1 from the heat transfer space DS. Further, the coolant is circulated between the chiller unit TU and the flow path 34f.

Figure 7:
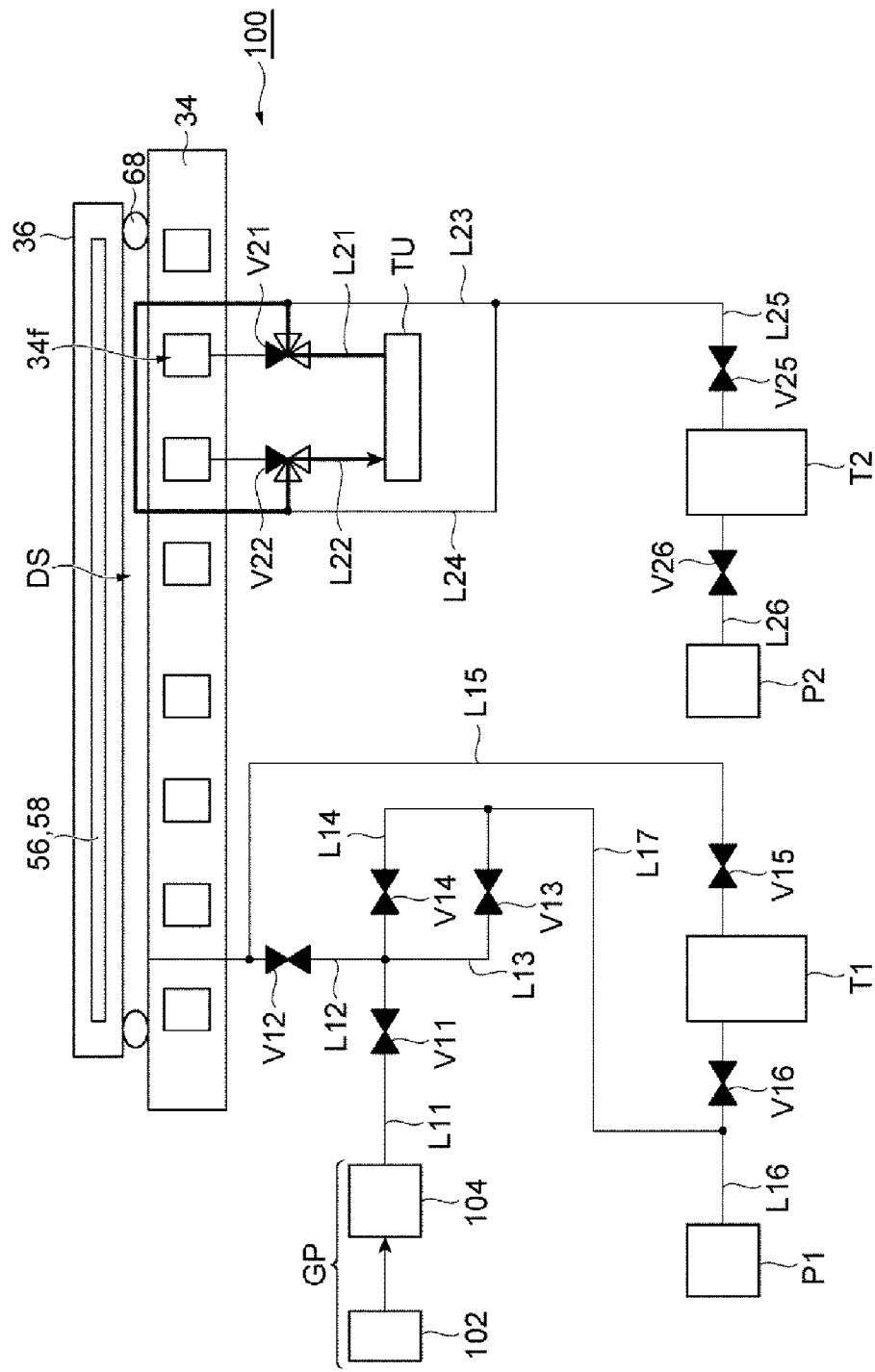
FIG. 7 is a diagram for describing the operation of the heat transfer medium supply system shown in FIG. 4.

Then, as depicted in FIG. 7, the heater 56 and the heater 58 are set to be OFF. Further, the valve V11, the valve V12, the valve V13, the valve V14, the valve V15 and the valve V16 are set to be closed. Further, the valve V25 and the valve V26 are also set to be closed. Furthermore, the valve V21 is set to be closed to the flow path 34f but to be open to the chiller unit TU and the line L23. In addition, the valve V22 is set to be closed to the flow path 34f and to be opened to the chiller unit TU and the line L24. That is, the valve V21 and the valve V22 are set to connect the chiller unit TU and the heat transfer space DS. Accordingly, the coolant is circulated between the chiller unit TU and the heat transfer space DS. Further, the coolant may be supplied into both the flow path 34f and the heat transfer space DS.

Figure 8:
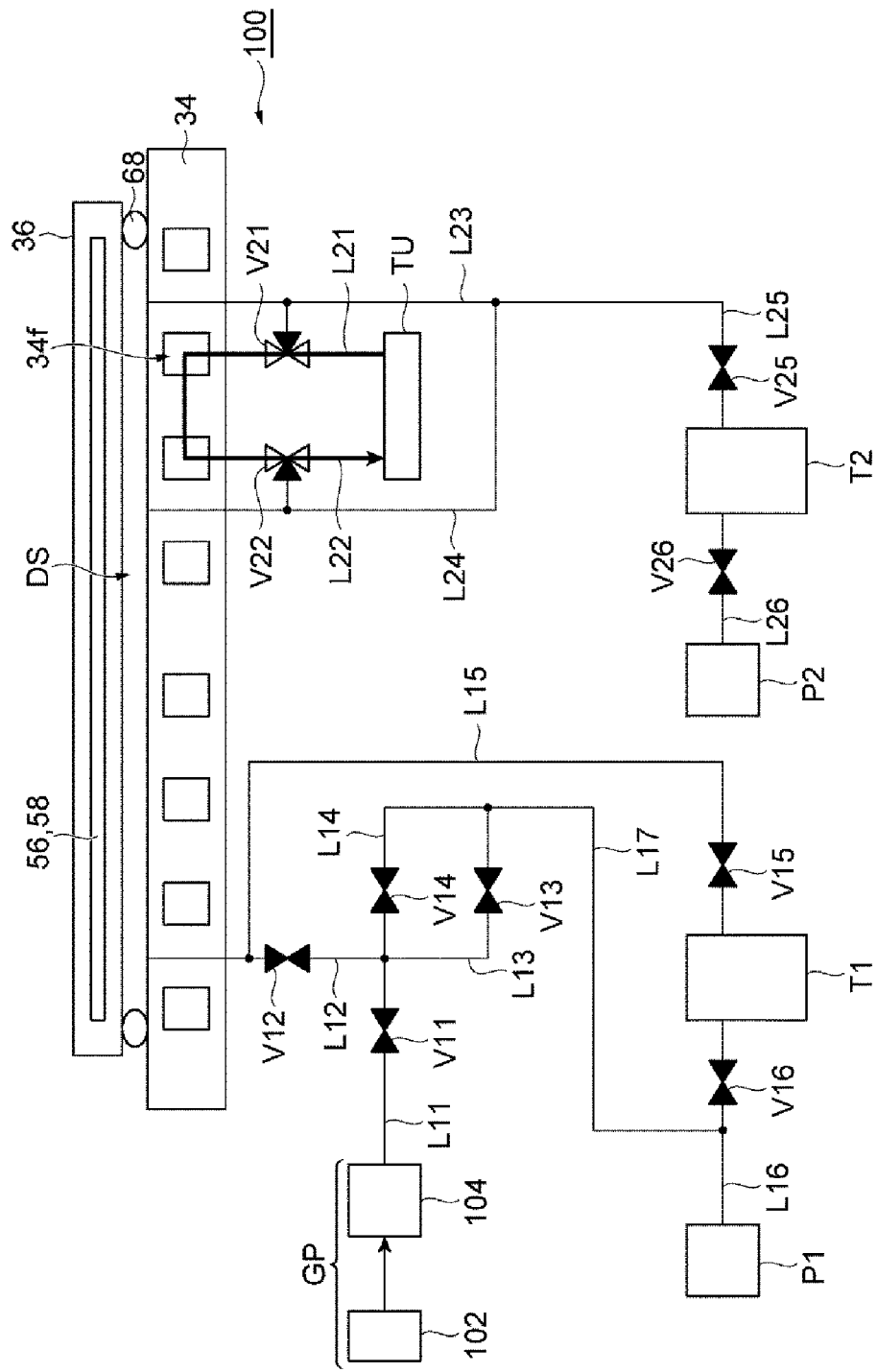
FIG. 8 is a diagram for describing the operation of the heat transfer medium supply system shown in FIG. 4.

If the temperature of the electrostatic chuck 36 reaches a target temperature, the heater 56 and the heater 58 are then set to be OFF, as depicted in FIG. 8. Further, the valve V11, the valve V12, the valve V13, the valve V14, the valve V15 and the valve V16 are set to be closed. Furthermore, the valve V25 and the valve V26 are set to be closed. In addition, the valve V21 and the valve V22 are set to be in the state where the chiller unit TU and the flow path 34f communicate with each other. Furthermore, the valve V21 is set to be closed to the line L23, and the valve V22 is set to be closed to the line L24. Accordingly, the coolant is circulated again between the chiller unit TU and the flow path 34f.

Figure 9:
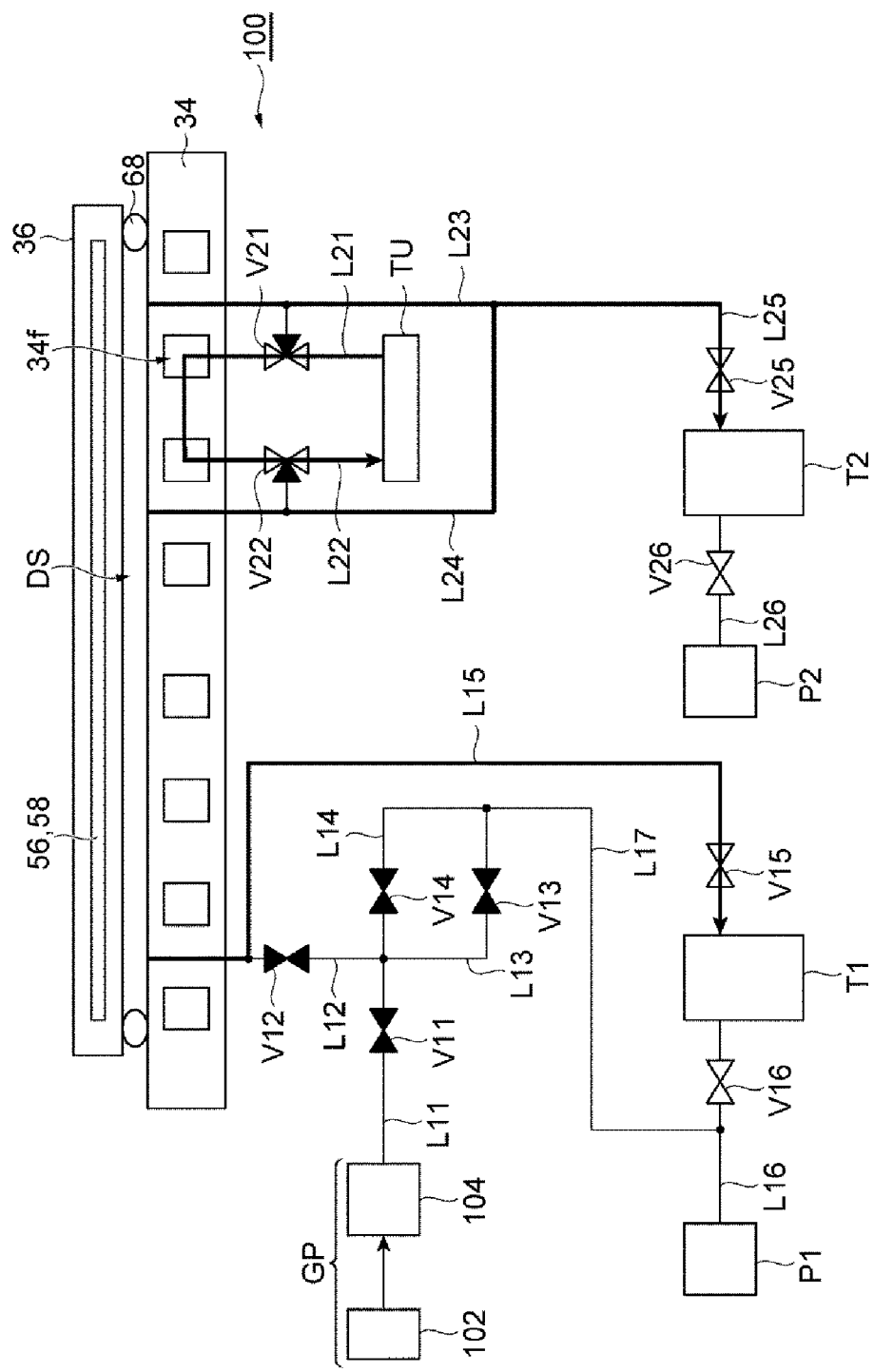
FIG. 9 is a diagram for describing the operation of the heat transfer medium supply system shown in FIG. 4.

Subsequently, as depicted in FIG. 9, the heater 56 and the heater 58 are set to be OFF. Further, the valve V11, the valve V12, the valve V13 and the valve V14 are set to be closed, and the valve V15 and the valve V16 are set to be open. Furthermore, the valve V25 and the valve V26 are set to be open. In addition, the valve V21 and the valve V22 are set to be in the state where the chiller unit TU and the flow path 34f communicate with each other. Further, the valve V21 is set to be closed to the line L23, and the valve V22 is set to be closed to the line L24. Accordingly, the state where the coolant is circulated between the chiller unit TU and the flow path 34f is maintained. Further, the coolant (liquid phase coolant) within the heat transfer space DS is discharged into the tank T1 and the tank T2.

Thereafter, as depicted in FIG. 5, the heat transfer gas from the supply unit GP may be supplied into the heat transfer space DS again, and the heater 56 and the heater 58 may be set to be ON.

In the plasma processing apparatus 10 equipped with the heat transfer medium supply system 100 as described above, the liquid phase coolant can be supplied into the heat transfer space DS to decrease the temperature of the electrostatic chuck 36. A speed of the temperature decrease of the electrostatic chuck 36 while the liquid phase coolant is being supplied into the heat transfer space DS is higher than a speed of the temperature decrease of the electrostatic chuck 36 while the heat transfer gas (e.g., He gas) is being supplied into the heat transfer space DS. By way of example, the speed of the temperature decrease of the electrostatic chuck 36 while supplying the fluorine-based liquid phase coolant as the liquid phase coolant into the heat transfer space DS is twice as high as the speed of the temperature decrease of the electrostatic chuck 36 while supplying the He gas into the heat transfer space DS. Thus, with the plasma processing apparatus 10 equipped with the heat transfer medium supply system 100, the temperature of the electrostatic chuck 36 can be decreased at a high speed.

Figure 10:
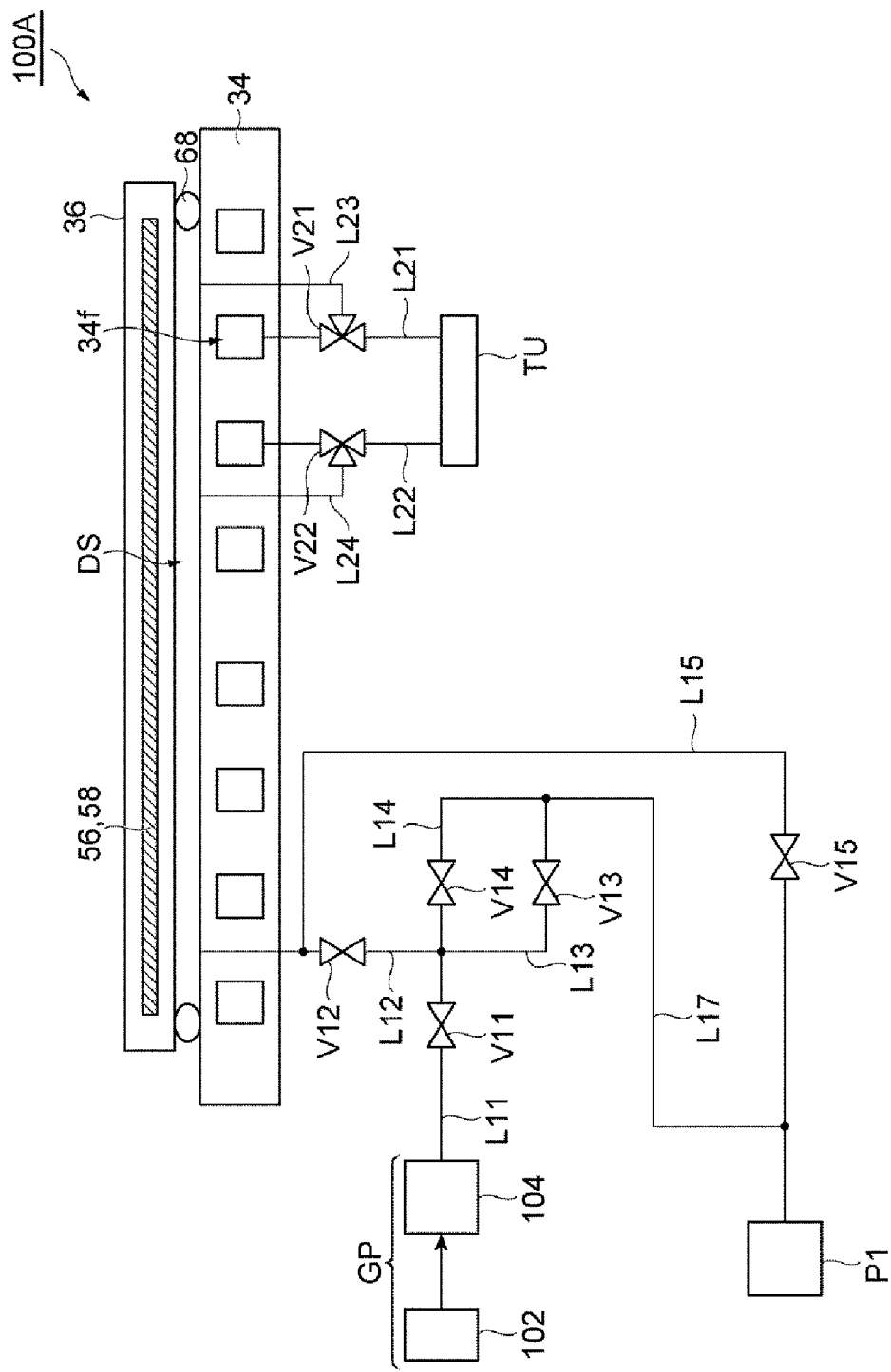
FIG. 10 is a diagram illustrating a configuration of a heat transfer medium supply system according to another exemplary embodiment.

Below, another heat transfer medium supply system which can be applied to the plasma processing apparatus 10 will be described. FIG. 10 is a diagram illustrating a heat transfer medium supply system according to another exemplary embodiment. In the heat transfer medium supply system 100A shown in FIG. 10, the chiller unit TU uses a coolant which performs the cooling by absorbing heat as it is vaporized. Such a coolant may be a hydrofluorocarbon-based coolant. The heat transfer medium supply system 100A equipped with the chiller unit TU using this coolant does not include, as compared to the heat transfer medium supply system 100, the tank T1, the line L16, the valve V16, the line L25, the valve V25, the tank T2, the line L26, the valve V26 and the dry pump P2. Accordingly, the heat transfer medium supply system 100A can be configured with a smaller number of components as compared to the heat transfer medium supply system 100. It is because the coolant supplied into the heat transfer space DS can be exhausted in a vaporized state in the heat transfer medium supply system 100A, as compared to the heat transfer medium supply system 100 in which the liquid phase coolant needs to be discharged from the heat transfer space DS.

In the heat transfer medium supply system 100A, the other end of the line L15 is connected to the dry pump P1. The other end of the line L17 is connected to the line L15 between the valve V15 and the dry pump P1. Further, the other end of the line L23 is connected to the valve V21, and the other end of the line L24 is connected to the valve V22.

Now, referring to FIG. 11 to FIG. 15, an operation of the heat transfer medium supply system 100A when decreasing the temperature of the electrostatic chuck 36 will be explained. In the operation described as follows, the heat transfer medium supply system 100A and the heater power supply 62 are controlled by the controller MCU. Further, in FIG. 11 to FIG. 15, the heater 56 and the heater 58 marked by black color are in an ON state, that is, in a state where electric current is being supplied to these heaters. Meanwhile, the heater 56 and the heater 58 marked by white color are in an OFF state. Further, the valves marked by white color are in an open state, whereas the valves marked by black color are in a closed state.

Figure 11:
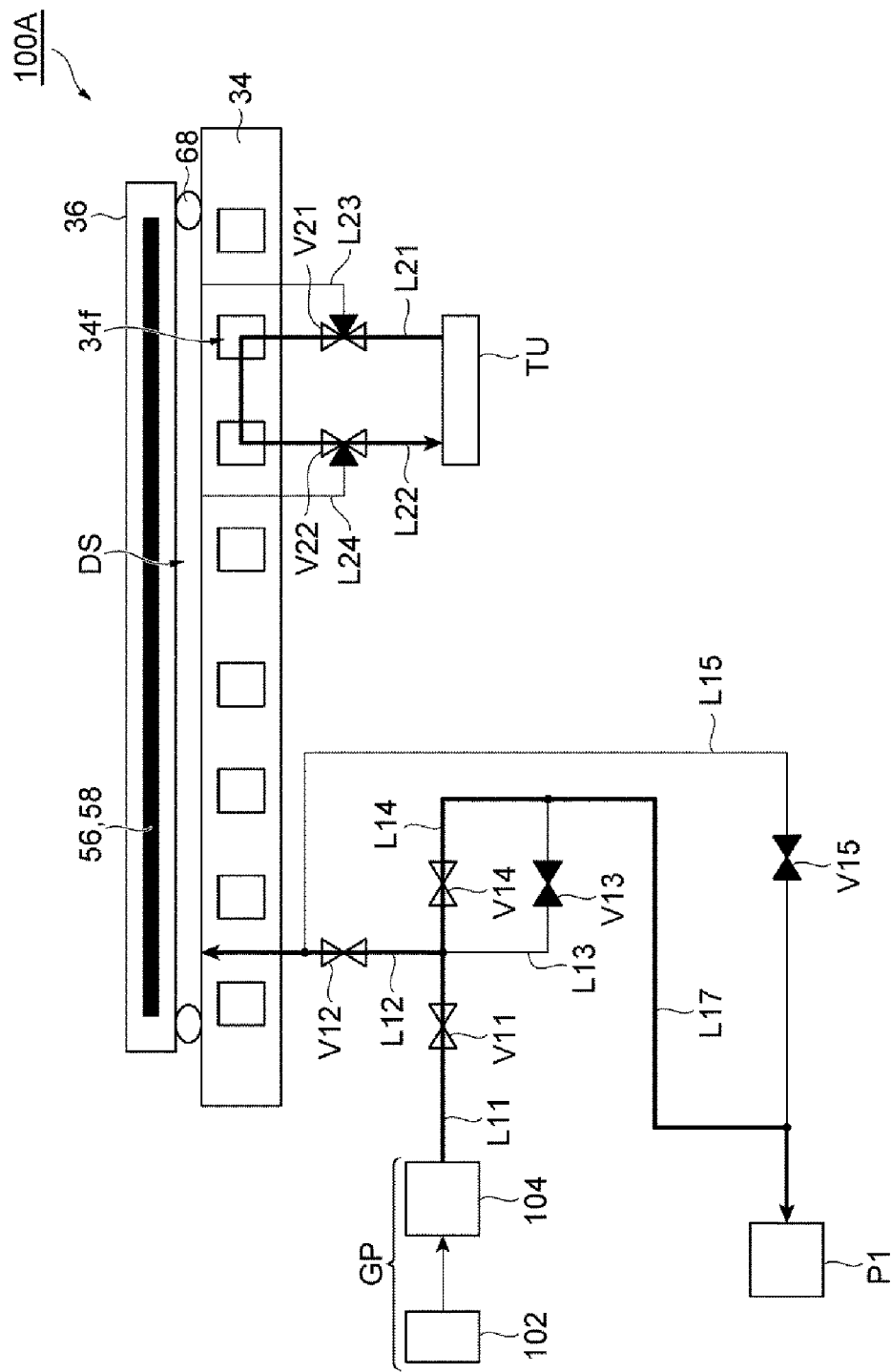
FIG. 11 is a diagram for describing an operation of the heat transfer medium supply system shown in FIG. 10.

First, as depicted in FIG. 11, in the state where the heater 56 and the heater 58 are ON, that is, in the state where the electrostatic chuck 36 is heated, the valve V11, the valve V12 and the valve V14 are set to be open, and the valve V13 and the valve V15 are set to be closed. Further, the valve V21 and the valve V22 are set to be in a state where the chiller unit TU and the flow path 34f communicate with each other. In addition, the valve V21 is set to be closed to the line L23, and the valve V22 is set to be closed to the line L24. Accordingly, the heat transfer gas from the supply unit GP is supplied into the heat transfer space DS. Further, the coolant is circulated between the chiller unit TU and the flow path 34f.

Figure 12:
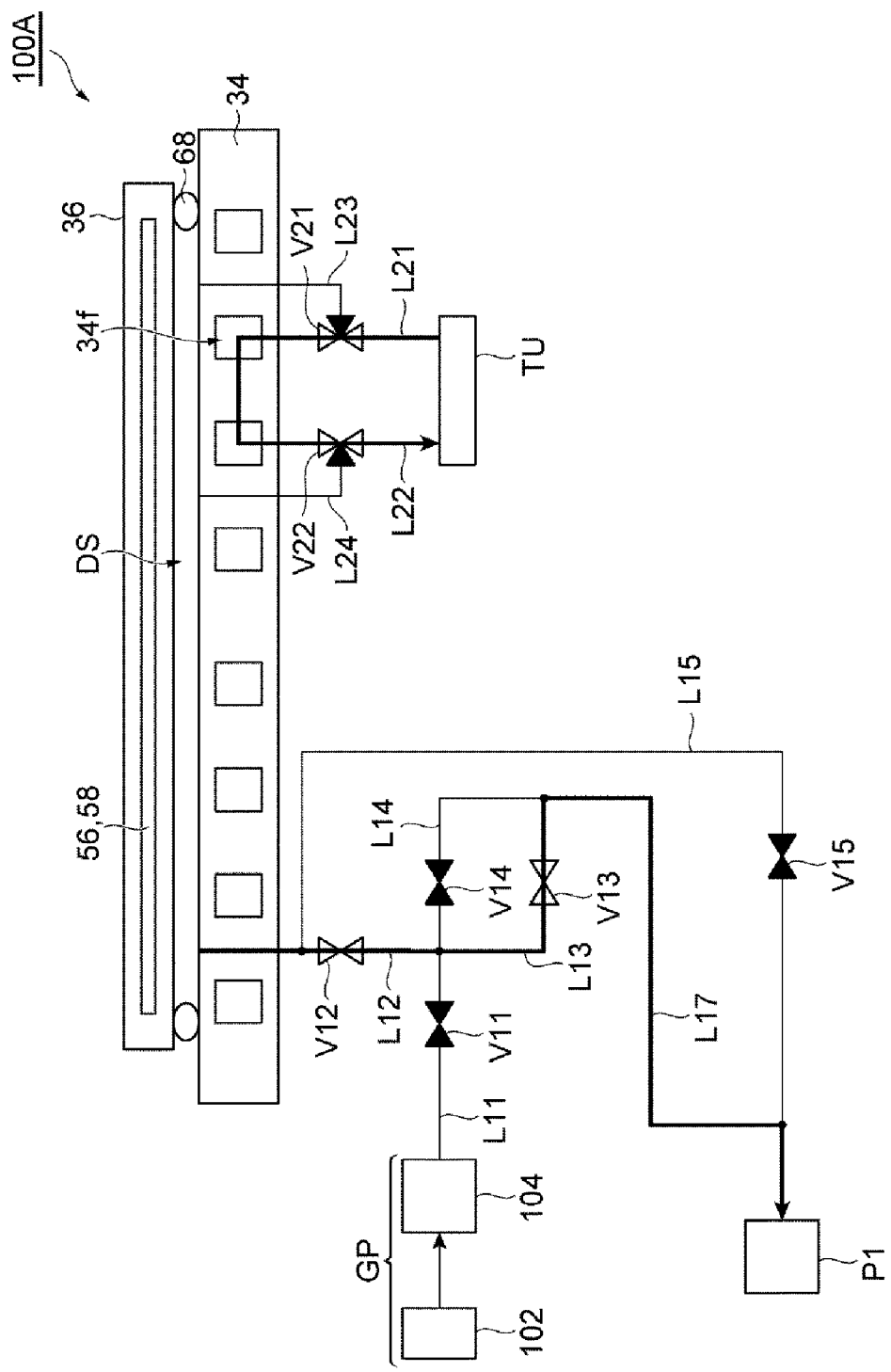
FIG. 12 is a diagram for describing the operation of the heat transfer medium supply system shown in FIG. 10.

From the state shown in FIG. 11, to decrease the temperature of the electrostatic chuck 36, the heater 56 and the heater 58 are set to be OFF, as depicted in FIG. 12. Further, the valve V12 and the valve V13 are set to be open, and the valve V11, the valve V14 and the valve V15 are set to be closed. Furthermore, the valve V21 and the valve V22 are set to allow the chiller unit TU and the flow path 34f to communicate with each other. Further, the valve V21 is set to be closed to the line L23, and the valve V22 is set to be closed to the line L24. Accordingly, the heat transfer gas is flown into the dry pump P1 from the heat transfer space DS. Further, the coolant is circulated between the chiller unit TU and the flow path 34f.

Figure 13:
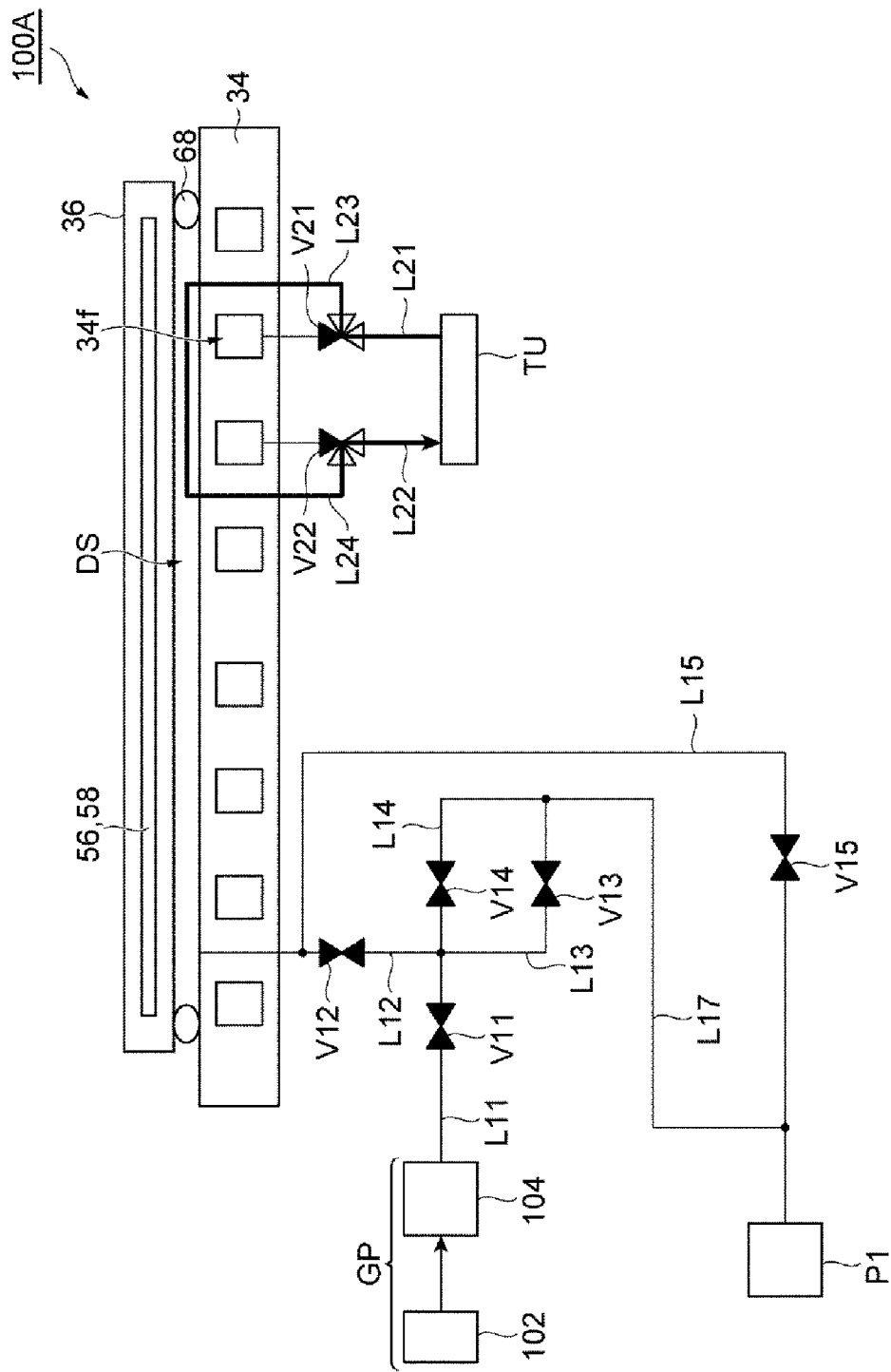
FIG. 13 is a diagram for describing the operation of the heat transfer medium supply system shown in FIG. 10.

Thereafter, as shown in FIG. 13, the heater 56 and the heater 58 are set to be OFF. Further, the valve V11, the valve V12, the valve V13, the valve V14 and the valve V15 are set to be closed. Furthermore, the valve V21 is set to be closed to the flow path 34f but to be open to the chiller unit TU and the line L23. Moreover, the valve V22 is set to be closed to the flow path 34f but to be open to the chiller unit TU and the line L24. That is, the valve V21 and the valve V22 are set to connect the chiller unit TU and the heat transfer space DS. Accordingly, the coolant is circulated between the chiller unit TU and the heat transfer space DS. Further, the coolant may be supplied into both the flow path 34f and the heat transfer space DS.

Figure 14:
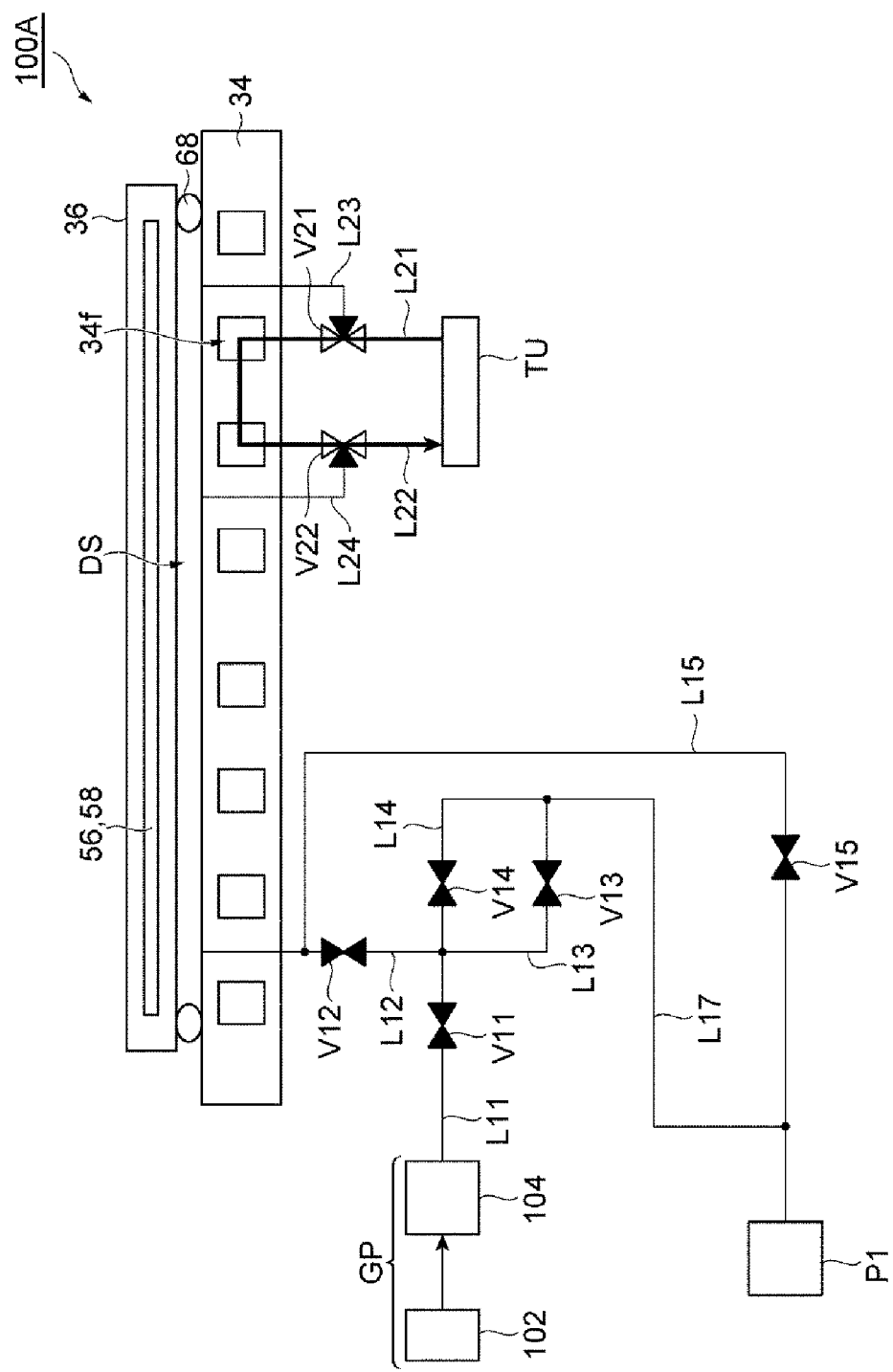
FIG. 14 is a diagram for describing the operation of the heat transfer medium supply system shown in FIG. 10.

If the temperature of the electrostatic chuck 36 reaches a target temperature, the heater 56 and the heater 58 are then set to be OFF, as depicted in FIG. 14. Further, the valve V11, the valve V12, the valve V13, the valve V14, and the valve V15 are set to be closed. Furthermore, the valve V21 and the valve V22 are set to be in the state where the chiller unit TU and the flow path 34f communicate with each other. Furthermore, the valve V21 is set to be closed to the line L23, and the valve V22 is set to be closed to the line L24. Accordingly, the coolant is circulated again between the chiller unit TU and the flow path 34f.

Figure 15:
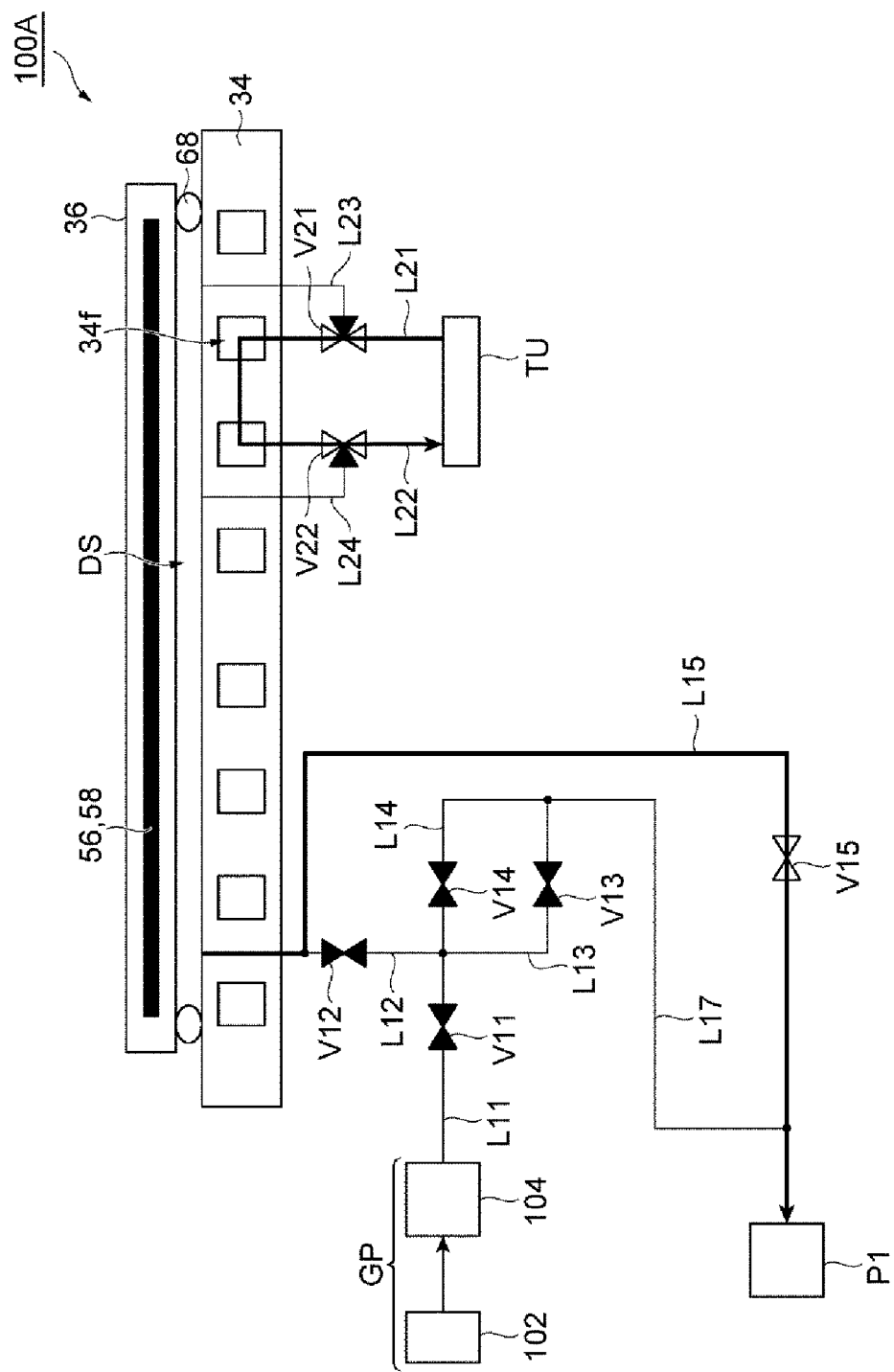
FIG. 15 is a diagram for describing the operation of the heat transfer medium supply system shown in FIG. 10.

Subsequently, the heater 56 and the heater 58 are set to be ON, as illustrated in FIG. 15, to vaporize the coolant within the heat transfer space DS securely and exhaust the vaporized coolant. Further, the valve V11, the valve V12, the valve V13 and the valve V14 are set to be closed, and the valve V15 is set to be open. Further, the valve V21 and the valve V22 are set to allow the chiller unit TU and the flow path 34f to communicate with each other. Further, the valve V21 is set to be closed to the line L23, and the valve V22 is set to be closed to the line L24. Accordingly, the state in which the coolant is circulated between the chiller unit TU and the flow path 34f is maintained. Further, the coolant within the heat transfer space DS is vaporized, and the vaporized coolant is exhausted by the dry pump P1.

Then, as depicted in FIG. 11, the heat transfer gas from the supply unit GP may be supplied into the heat transfer space DS again, and the heater 56 and the heater 58 may be set to be ON.

In the plasma processing apparatus 10 equipped with the heat transfer medium supply system 100A as described above, a speed of the temperature decrease of the electrostatic chuck 36 while the coolant is supplied into the heat transfer space DS is three times as high as a speed of the temperature decrease of the electrostatic chuck 36 while the He gas is supplied into the heat transfer space DS. Thus, with the plasma processing apparatus 10 equipped with the heat transfer medium supply system 100A, the temperature of the electrostatic chuck 36 can be decreased at a higher speed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. By way of example, the high frequency power supply 42 may be connected to the upper electrode 16 via the matching device 46. Further, the above-described mounting table 14 may also be applicable to, in addition to the capacitively coupled plasma processing apparatus, any of various types of plasma processing apparatuses, such as an inductively coupled plasma processing apparatus, a plasma processing apparatus using a surface wave such as a microwave for plasma generation, and so forth.

We claim:

1. A mounting table, comprising:
a cooling table made of a metal and provided with a flow path for a coolant;
a power feed body that is in contact with the cooling table, made of aluminum or an aluminum alloy and configured to transmit a high frequency power from a high frequency power supply,
an electrostatic chuck comprising a conductive base provided on the cooling table; and an attraction unit made of ceramics, having therein an attraction electrode and a heater, which is provided on the base and fastened to the base by metal bonding;
a first elastic member having insulating property, which is provided between the cooling table and the base, and is configured to allow the electrostatic chuck to be spaced apart from the cooling table and configured to form, along with the cooling table and the base, a heat transfer space into which a heat transfer gas is supplied between the cooling table and the base; and
a clamping member, made of a metal and in contact with the cooling table and the base, allowing the base and the first elastic member to be interposed between the cooling table and the clamping member,
wherein the high frequency power is supplied from the high frequency power supply to the electrostatic chuck via the power feed body and the cooling table.

2. The mounting table of claim 1,
wherein the cooling table includes a first central portion and a first peripheral portion which is continuous with the first central portion and extended in a circumferential direction at an outside of the first central portion in a diametric direction,
the base is provided on the first central portion, and includes a second central portion and a second peripheral portion which is continuous with the second central portion and extended in the circumferential direction at an outside of the second central portion in the diametric direction, and
the clamping member includes a cylindrical portion having a first bottom surface and an annular portion which has a second bottom surface and is inwardly extended from a top portion of the cylindrical portion in the diametric direction, and the clamping member is fastened to the first peripheral portion such that the first bottom surface is in contact with a top surface of the first peripheral portion and the second bottom surface is in contact with a top surface of the second peripheral portion.

3. The mounting table of claim 2, further comprising:
a second elastic member which is an O-ring having insulating property and provided between an inner circumferential portion of the annular portion and the top surface of the second peripheral portion.

4. The mounting table of claim 3,
wherein a reaction force generated by the first elastic member is larger than a reaction force generated by the second elastic member.

5. The mounting table of claim 1,
wherein the first elastic member is an O-ring made of perfluoroelastomer.

6. The mounting table of claim 1,
wherein the attraction unit is provided with a first gas line configured to supply the heat transfer gas into a gap between the attraction unit and a substrate placed on the attraction unit, the cooling table is provided with a second gas line configured to supply the heat transfer gas supplied into the first gas line,
the mounting table further comprises a sleeve configured to connect the first gas line and the second gas line,
at least a surface of the sleeve has insulating property, and the surface of the sleeve is made of ceramics,
the base and the cooling table provide an accommodation space in which the sleeve is accommodated,
the base has a surface which forms the accommodation space and a film made of insulating ceramics is formed on the surface of the base, and
the mounting table further comprises a third elastic member which is an O-ring having insulating property and is configured to seal the accommodation space between the film and the cooling table.

7. The mounting table of claim 6, further comprising:
a fourth elastic member which is an O-ring having insulating property and provided between the cooling table and the base at an outside of the third elastic member, and is configured to form the heat transfer space along with the first elastic member.

8. The mounting table of claim 7,
wherein the fourth elastic member is made of perfluoroelastomer.

9. The mounting table of claim 1,
wherein the clamping member is made of titanium.

10. The mounting table of claim 1,
wherein the ceramics, by which the attraction unit is made, is aluminum oxide.

11. A plasma processing apparatus, comprising:
a processing vessel;
a mounting table, as claim in claim 1, configured to support a substrate within the processing vessel; and
a high frequency power supply electrically connected to the power feed body of the mounting table.

12. The plasma processing apparatus of claim 11, further comprising:
a heat transfer medium supply system configured to supply the heat transfer gas or the coolant into the heat transfer space selectively.

13. The plasma processing apparatus of claim 12,
wherein the coolant is a liquid phase coolant, and
the heat transfer medium supply system includes:
   a supply unit configured to supply the heat transfer gas into the heat transfer space;
   a first tank;
   a first dry pump;
   a first line having one end connected to the supply unit and the other end;
   a first valve provided at a portion of the first line;
   a second line having one end connected to the other end of the first line and the other end connected to the heat transfer space;
   a second valve provided at a portion of the second line;
   a third line having one end connected to the other end of the first line and the other end;
   a third valve provided at a portion of the third line;
   a fourth line having one end connected to the other end of the first line and the other end connected to the other end of the third line;
   a fourth valve provided at a portion of the fourth line;
   a fifth line having one end connected to the second line between the second valve and the heat transfer space and the other end connected to the first tank;
   a fifth valve provided at a portion of the fifth line;
   a sixth line having one end connected to the first tank and the other end connected to the first dry pump;
   a sixth valve provided at a portion of the sixth line;
   a seventh line having one end connected to the other end of the third line and the other end connected to the sixth line between the sixth valve and the first dry pump;
   a chiller unit configured to supply the coolant;
   a second tank;
   a second dry pump;
   a first coolant line configured to supply the coolant into the flow path of the cooling table, and configured to connect the flow path of the cooling table and the chiller unit;
   a second coolant line configured to collect the coolant from the flow path of the cooling table, and configured to connect the flow path of the cooling table and the chiller unit;
   a third coolant line having one end connected to the heat transfer space and the other end;
   a fourth coolant line having one end connected to the heat transfer space and the other end connected to the other end of the third coolant line;
   a first coolant valve provided at a portion of the first coolant line, and configured to connect the chiller unit to the flow path of the cooling table or the third coolant line selectively;
   a second coolant valve provided at a portion of the second coolant line, and configured to connect the chiller unit to the flow path of the cooling table or the fourth coolant line selectively;
   a fifth coolant line having one end connected to the other end of the third coolant line and the other end connected to the second tank;
   a third coolant valve provided at a portion of the fifth coolant line;
   a sixth coolant line configured to connect the second tank and the second dry pump; and
   a fourth coolant valve provided at a portion of the sixth coolant line.

14. The plasma processing apparatus of claim 13, further comprising:
a heater power supply for the heater; and
a controller configured to control the heat transfer medium supply system and the heater power supply,
wherein the controller is configured to control the heat transfer medium supply system and the heater power supply to create a state in which the first valve, the second valve and the fourth valve are opened; the third valve, the fifth valve and the sixth valve are closed; the first coolant valve and the second coolant valve allow the chiller unit and the flow path of the cooling table to be connected; the third coolant valve and the fourth coolant valve are closed; and the heater is set to be ON,
the controller is configured to control the heat transfer medium supply system and the heater power supply to create a state in which the first valve, the fourth valve, the fifth valve and the sixth valve are closed; the second valve and the third valve are opened; the first coolant valve and the second coolant valve allow the chiller unit and the flow path of the cooling table to be connected; the third coolant valve and the fourth coolant valve are closed; and the heater is set to be OFF, the controller is configured to control the heat transfer medium supply system and the heater power supply to create a state in which the first valve, the second valve, the third valve, the fourth valve, the fifth valve and the sixth valve are closed; the first coolant valve and the second coolant valve allow the chiller unit and the heat transfer space to be connected; the third coolant valve and the fourth coolant valve are closed; and the heater is set to be OFF, the controller is configured to control the heat transfer medium supply system and the heater power supply to create a state in which the first valve, the second valve, the third valve, the fourth valve, the fifth valve and the sixth valve are closed; the first coolant valve and the second coolant valve allow the chiller unit and the flow path of the cooling table to be connected; the third coolant valve and the fourth coolant valve are closed; and the heater is set to be OFF, and the controller is configured to control the heat transfer medium supply system and the heater power supply to create a state in which the first valve, the second valve, the third valve and the fourth valve are closed; the fifth valve and the sixth valve are opened; the first coolant valve and the second coolant valve allow the chiller unit and the flow path of the cooling table to be connected; the third coolant valve and the fourth coolant valve are opened; and the heater is set to be OFF.

15. The plasma processing apparatus of claim 12, wherein the coolant is a hydrofluorocarbon-based coolant, and the heat transfer medium supply system includes:
a supply unit configured to supply the heat transfer gas into the heat transfer space;
a first dry pump;
a first line having one end connected to the supply unit and the other end;
a first valve provided at a portion of the first line;
a second line having one end connected to the other end of the first line and the other end connected to the heat transfer space;
a second valve provided at a portion of the second line;
a third line having one end connected to the other end of the first line and the other end;
a third valve provided at a portion of the third line;
a fourth line having one end connected to the other end of the first line and the other end connected to the other end of the third line;
a fourth valve provided at a portion of the fourth line;
a fifth line having one end connected to the second line between the second valve and the heat transfer space and the other end connected to the first dry pump;
a fifth valve provided at a portion of the fifth line;
a sixth line having one end connected to the other end of the third line and the other end connected to the fifth line between the fifth valve and the first dry pump;
a chiller unit configured to supply the coolant;
a first coolant line configured to supply the coolant into the flow path of the cooling table, and configured to connect the flow path of the cooling table and the chiller unit;
a second coolant line configured to collect the coolant from the flow path of the cooling table, and configured to connect the flow path of the cooling table and the chiller unit;
a third coolant line having one end connected to the heat transfer space;
a fourth coolant line having one end connected to the heat transfer space;
a first coolant valve provided at a portion of the first coolant line, and configured to connect the chiller unit to the flow path of the cooling table or the third coolant line selectively; and
a second coolant valve provided at a portion of the second coolant line, and configured to connect the chiller unit to the flow path of the cooling table or the fourth coolant line selectively.

16. The plasma processing apparatus of claim 15, further comprising:
a heater power supply for the heater; and
a controller configured to control the heat transfer medium supply system and the heater power supply,
wherein the controller is configured to control the heat transfer medium supply system and the heater power supply to create a state in which the first valve, the second valve and the fourth valve are opened; the third valve and the fifth valve are closed; the first coolant valve and the second coolant valve allow the chiller unit and the flow path of the cooling table to be connected; and the heater is set to be ON, the controller is configured to control the heat transfer medium supply system and the heater power supply to create a state in which the first valve, the fourth valve and the fifth valve are closed; the second valve and the third valve are opened; the first coolant valve and the second coolant valve allow the chiller unit and the flow path of the cooling table to be connected; and the heater is set to be OFF, the controller is configured to control the heat transfer medium supply system and the heater power supply to create a state in which the first valve, the second valve, the third valve, the fourth valve and the fifth valve are closed; the first coolant valve and the second coolant valve allow the chiller unit and the heat transfer space to be connected; and the heater is set to be OFF, the controller is configured to control the heat transfer medium supply system and the heater power supply to create a state in which the first valve, the second valve, the third valve, the fourth valve and the fifth valve are closed; the first coolant valve and the second coolant valve allow the chiller unit and the flow path of the cooling table to be connected; and the heater is set to be OFF, and the controller is configured to control the heat transfer medium supply system and the heater power supply to create a state in which the first valve, the second valve, the third valve and the fourth valve are closed; the fifth valve is opened; the first coolant valve and the second coolant valve allow the chiller unit and the flow path of the cooling table to be connected; and the heater is set to be ON.

* * * * *